United States Patent [19]

Crittenden

[11] 4,052,676
[45] Oct. 4, 1977

[54] DIGITAL-ANALOG FREQUENCY ERROR SIGNALING

[75] Inventor: Bernard R. Crittenden, Rockford, Ill.

[73] Assignee: Woodward Governor Company, Rockford, Ill.

[21] Appl. No.: 694,770

[22] Filed: June 10, 1976

[51] Int. Cl.² .................. H03D 3/02; G01R 25/08
[52] U.S. Cl. .................... 328/134; 328/129; 328/155; 328/141; 324/186; 235/92 TF; 235/92 FQ; 364/103
[58] Field of Search ............ 328/134, 141, 129, 130; 307/232, 233; 324/181, 186, 188; 235/151.1, 92 FQ, 92 TF; 318/594, 607

[56] References Cited

U.S. PATENT DOCUMENTS

| | | | |
|---|---|---|---|
| 3,050,708 | 8/1962 | Van Alstyne et al. | 328/129 X |
| 3,509,476 | 4/1970 | Roth | 328/134 |
| 3,521,174 | 7/1970 | Naubereit et al. | 328/134 X |
| 3,663,884 | 5/1972 | Pattantyus | 328/134 |
| 3,714,463 | 1/1973 | Laune | 307/232 |
| 3,854,472 | 12/1974 | Giroi et al. | 324/186 X |
| 3,868,845 | 3/1975 | Shimizu | 328/129 X |
| 3,936,745 | 2/1976 | Harrington | 324/186 |

Primary Examiner—John S. Heyman

Attorney, Agent, or Firm—Leydig, Voit, Osann, Mayer & Holt, Ltd.

[57] ABSTRACT

A frequency or speed error circuit for producing a dc. voltage which in polarity and magnitude varies according to the sense and the size of the error between a variable input frequency and a set point frequency. The period of successive cycles of the variable frequency incoming signal is digitally compared with a fixed, predetermined time interval measured off by a precision standard interval generator to produce pulses which vary in width according to the magnitude of the error. The latter pulses are treated as negative or positive when the variable period is shorter or longer than the standard time interval, and are algebraically summed by an operational amplifier having a filter to produce the dc. voltage with a magnitude corresponding to the average of the summed pulses. A deadband is created by optional devices added to the digital comparator. Infinitely fine resolution is achieved by the gating and counter components of the standard time interval generator, thereby to avoid the ambiguity of a measured standard interval possibly being other than an integral multiple of the period of precision frequency clock pulses.

23 Claims, 15 Drawing Figures

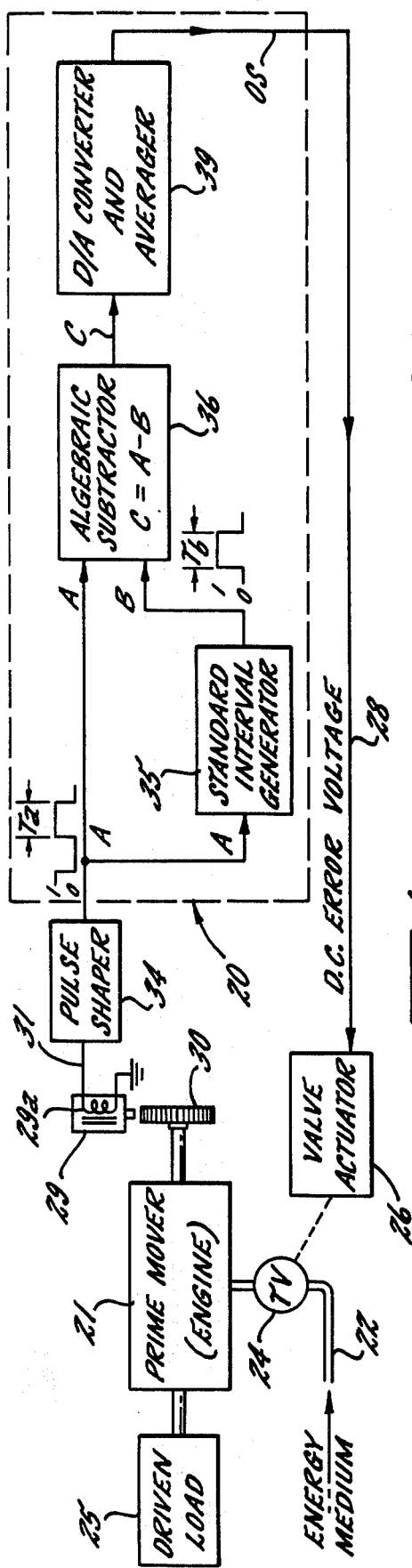
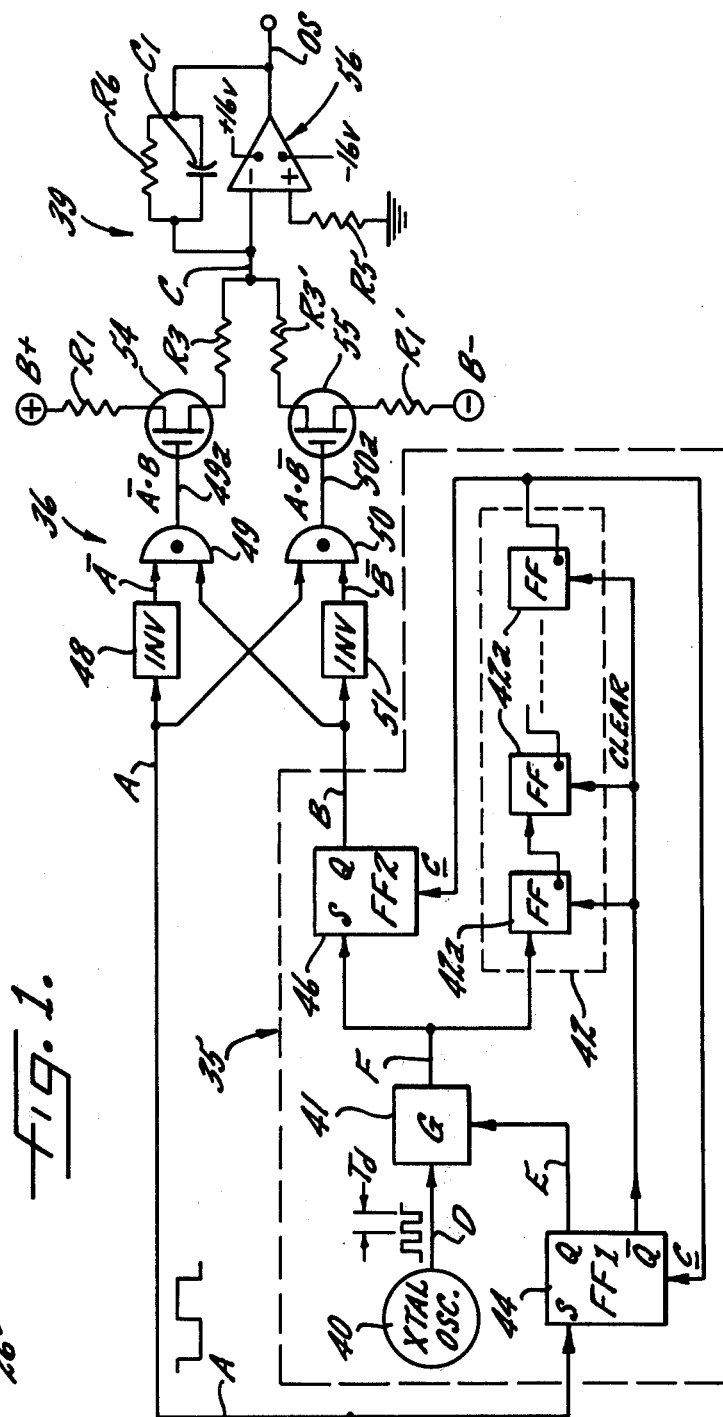
Fig. 1.
Fig. 2.

DIGITAL-ANALOG FREQUENCY ERROR SIGNALING

FIELD OF THE INVENTION

The present invention relates in general to methods and apparatus for producing a signal which varies as a detected speed or frequency error, i.e., departure from a set point. Such methods and apparatus find useful application in closed loop automatic speed governing or frequency control systems. In those systems, the final output speed or generated signal frequency may, for a variety of reasons or disturbances, depart from a desired (set point) value, and in such cases the detected error is converted into an error signal utilized to make corrective adjustment at the prime mover or frequency generator so as to reduce and hold the error essentially at a zero value.

More specifically, the present invention relates to frequency error signaling methods and apparatus in which signals are processed initially and principally in a digital fashion, and then finally converted to a variable bipolar analog error signal, such as a dc. voltage.

BRIEF SUMMARY OF THE INVENTION

It is the general aim of the invention to provide methods and apparatus for receiving a variable frequency input signal and producing an output signal which varies according to the error or departure from a desired set point frequency value —and wherein the methods and apparatus are relatively simple, low in cost, but yield high accuracy and reliability in the final output.

An ancillary object of the invention is to provide such methods and apparatus which are digital in nature up to the final conversion to an analog variable dc. output signal representing the frequency error, and yet which function in a bipolar sense to accommodate both positive and negative frequency errors.

Another object is to achieve such bipolar digital processing of signals by methods and apparatus involving relatively simple Boolean logic to perform, in effect, subtraction of quantities representing the sensed variable frequency and the desired set point frequency.

It is yet another object to provide such frequency error signaling methods and apparatus in which an adjustable deadband characteristic in the output signal is achieved by the addition of only a few method steps and apparatus components.

Still another objective is to bring forth methods and apparatus for producing an analog signal representing a frequency error, wherein the signal processing is principally digital in nature, and yet in which the resolution of the final output signal is essentially infinite and finer than the nearest increment of digital sensitivity.

A related object is to provide methods and apparatus for measuring off time intervals with extremely high precision and uniformity, each such interval beginning in response to each of a succession of stimulating input signals, by employing a counter into which clock pulses from a precision frequency source are gated —and characterized in that each time interval is always an integral multiple of the period of the clock pulses.

These and other objects and advantages will become apparent from the following detailed description which is to be taken in conjunction with the accompanying drawings.

DESCRIPTION OF THE DRAWINGS

FIG. 1 is a general block diagram of an exemplary embodiment of frequency or speed error signaling apparatus constructed and operating according to the present invention, such apparatus being shown for background purposes as a part of a closed loop speed governing system;

FIG. 2 corresponds to a portion of FIG. 1 and illustrates in more detailed block diagram form the frequency error signaling apparatus;

Figure 3:
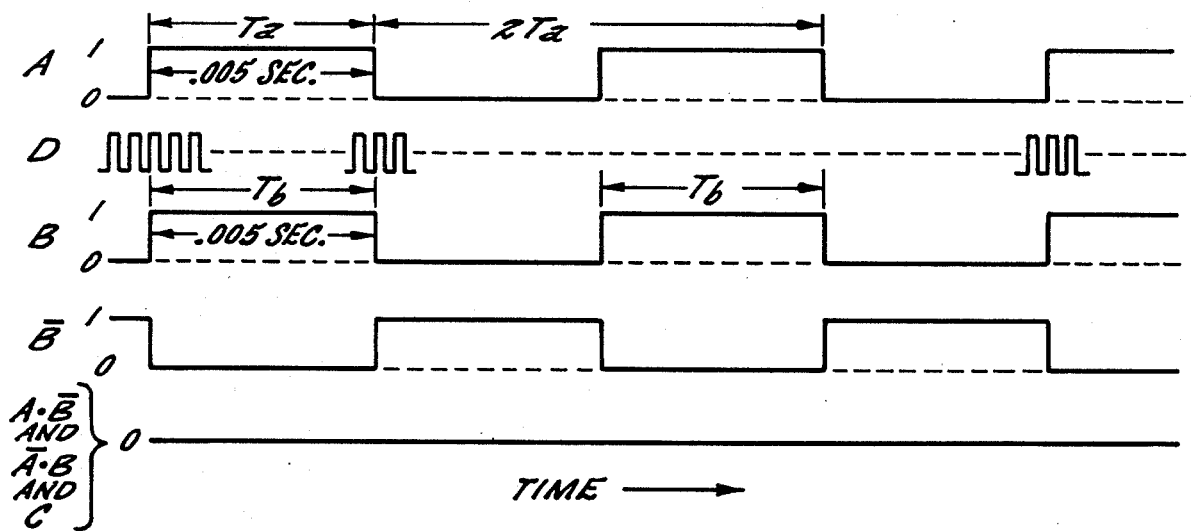
FIGS. 3, 4 and 5 are graphical waveforms, plotted against time, showing the manner in which different signals vary during operation of the apparatus in FIG. 2, specifically under conditions when the incoming, variable frequency signal is equal to, greater than, or less than the set point frequency.

While the invention has been shown and will be described in some detail with reference to illustrative and preferred embodiments, there is no intention thus to limit it to such detail. On the contrary, it is intended here to cover all modifications, alternatives and equivalents falling within the scope of the appended claims.

DETAILED DESCRIPTION

In order to make clear one environment in which the present invention will find advantageous use, FIG. 1 illustrates a speed governing system incorporating as a part thereof frequency error signaling apparatus 20. In the speed governing system, a prime mover 21 such as a diesel or gasoline engine receives an energy medium or fuel via an inlet conduit 22 and a throttle valve 24 which is opened or closed to increase or decrease the rate of fuel input. As a driven load 25 coupled to the prime mover 21 imposes greater or lesser torque, the speed of the prime mover 21 will tend to decrease or increase, and it is necessary under these circumstances to open or close the throttle valve 24 so as to restore the engine to a predetermined, desired set point speed. For this purpose, an analog error voltage is applied to an electromechanical or electrohydraulic actuator 26 to reposition the throttle 24. When the dc. error voltage applied by line 28 to the actuator 26 is restored to zero (thereby indicating that the set point speed has been achieved) the throttle valve 24 remains at its then-established position.

The value of the set point speed is determined or established by components which are inside of the error signaling apparatus 20, as hereinafter explained. In order to sense the actual speed of the prime mover, however, a magnetic pickup 29 is disposed in closely spaced relation to a toothed wheel or gear 30 driven directly by or in timed relation to the prime mover 21. As is well known in the art, as each tooth on the wheel 30 passes the core of the pickup 29, a pulse is induced in a winding 29a, and the train of pulses appearing on the conductor 31 has a frequency proportional to the speed (r.p.m.) of the prime mover. The output wave 32 (FIG. 2) of the pickup 29 may be approximately sinusoidal. It is fed to a suitable and well known type of pulse shaper 34 for conversion into a recurring square wave which forms the input signal A to the error detecting and signaling device 20. The pulse shaper may, for example, also include a frequency divider to "scale" the frequency of the input signal A relative to the speed of the prime mover 21 so that the latter runs at the desired set point speed when the signal A has a predetermined set point frequency. For example, if it is desired that the engine 21 be controlled to run at 1800 r.p.m. and the pickup signal 32 then has a frequency of 5400 Hz., the shaper 34 may include a divider having a frequency division ratio of 54 to make the signal A normally have a frequency of 100 Hz. As the engine speed drops or rises by 50 percent to 900 or 2700 r.p.m., the frequency of the input signal A will fall or increase to 50 or 150 Hz., respectively. Of course, by adjusting the ratio of the gears driving the toothed wheel 30 from the engine crankshaft, the number of teeth on that wheel or the frequency dividing factor (if any) in the shaper 34, the scaling factor relating the frequency of the signal A to engine speed may be given any desired value.

It will thus be seen that the frequency of the input signal A is proportional to engine speed. For purposes of discussion, the error-signaling device 20 may be viewed as producing an output signal which is proportional to the difference between the variable frequency $f_a$ of the input signal A and a set point frequency $f_s$ (the latter being established in the device 20 as explained below). As the engine departs from set point speed for any reason, such as a change in the load 25, and the frequency $f_a$ departs from the set point frequency $f_s$, the error signal on line 28 departs from zero and corresponds in polarity and magnitude to the sense and extent of the error, thereby to energize the actuator 26 and adjust the throttle valve 24 until the speed error, the frequency error, and the error signal are restored to zero. While the frequency $f_a$ is here discussed as representing speed of the engine 21, in the broader sense the signal A is representative of any successively recurring events and its frequency corresponds to the frequency of such events as sensed by any appropriate pickup device.

Manifestly, the period of the recurring signal A is inversely proportional to its frequency. For purposes of discussion, however, the signal A will be viewed as a recurring square wave which switches alternately between logic 0 and 1 (low and high) levels; and the more positive half waves will be viewed as constituting the input signal. The successive half wave periods $T_a$ are thus variable in duration according to the known relation:

$$T_a = \frac{1}{2f_a}$$

Assuming a set point $f_s$ of 100 Hz., the period $T_a$ is normally (when the frequency error is zero):

$$T_a = \frac{1}{2 \times 100} = .005 \text{ seconds}$$

In carrying out the present invention, means are provided to measure off a precise interval in time beginning substantially at those instants when each square wave of the signal A begins. For this purpose, the signal A is applied to a standard interval generator 35 which produces, each time it is triggered, an output signal B enduring for a predetermined time $T_b$. The construction and the adjusted setting of the interval generator 35 35 establishes the set point frequency $f_s$, and in the present example where it is assumed that the set point is 100 Hz., then the interval $T_b$ is chosen to be equal to the set point value of 0.005 seconds for the period $T_a$. The standard interval generator is triggered, as noted more fully below, by each positive-going wave front (0 to 1 level transition) in the signal A and thus substantially coincidentally with the start of each time period $T_a$.

Further in the practice of the invention, the time periods $T_a$ and $T_b$ reflected by the signals A and B are compared by digital subtraction in a subtractor 36 to which the signals A and B are fed. As explained hereinafter, the algebraic subtractor produces an output signal C which, in effect, is formed by pulses of constant amplitude but variable in duration according to the time difference $T_b - T_a$. Those pulses are of positive polarity when the actual frequency $f_a$ is above the set point $f_s$ and $T_b > T_a$; conversely they are of negative polarity when the frequency $f_a$ is below the set point and $T_b < T_a$.

The variable width pulses forming the signal C are transmitted to a digital-to-analog converter 39 which includes an integrating filter to produce a final analog output signal OS in the form of a bipolar dc. voltage on line 28. This voltage is of positive or negative polarity when the frequency $f_a$ is below or above the set point, and it has a magnitude proportional to the extent of the frequency error.

The method and apparatus generally depicted in FIG. 1 may be better understood from the more detailed block diagram in FIG. 2. The standard interval generator 35 comprises a precision frequency source of pulses (herein for brevity called clock pulses) in the form of a crystal oscillator 40 continuously producing pulses indicated at D of a predetermined and fixed frequency which is higher than the highest expected frequency of the input signal A. The clock pulse signal D alternately switches between logic 0 and 1 (high and low) levels and is supplied to the input of suitable gating means here shown as an AND gate 41. That gate is normally closed (i.e., will not pass the signal D), but it is enabled or disabled when a control signal E applied thereto is at a logic 1 or 0 level.

In order to measure off successive and precise time intervals $T_b$, the output of the gate 41 is coupled to the input of a counter 42 in a fashion such that a predetermined number of the clock pulses D are registered during each of successive counting cycles. The counter 42 in the present instance, and by way of example, registers a count in response to each positive-going wave front (0 to 1 level transition) applied to its input.

To cause the counter to count a predetermined number of the pulses D during each counting cycle, and with each cycle being initiated substantially at the beginning of each input signal square wave A, the signal A is applied to the "set" input of a bistate device here shown as a flip-flop 44 having its output terminal Q connected to supply the control signal E to the gate 41. More particularly, as each positive-going wave front of the signal A appears, it sets the flip-flop 44 so that the signal E switches from 0 to a 1 logic level, thereby enabling the gate 41 so that the pulses D are passed to the input of the counter 42. Assuming for the moment that the counter has been previously reset to a predetermined reset count state (for example, zero), the counter will thereupon receive and register the clock pulses D until it reaches a predetermined count state which, in the present embodiment, is a return to the zero count state. At that instant, the last stage of the counter produces a carry response, i.e., a signal which switches from a 0 to a 1 level. This latter signal is fed back to the "clear" terminal c of the flip-flop 44, thereby resetting that flip-flop. The control signal E thus switches to a 0 level to disable the gate 41 and terminate the entry of clock pulses D into the counter 42. Simultaneously, the $\overline{Q}$ output terminal of the flip-flop 44 switches from a 0 to a 1 logic level and this positive wave front is applied to the counter, resetting the latter to a zero count state. Thus, in the exemplary arrangement here shown, if the counter has a count capacity of N, it will receive N clock pulses each time the flip-flop 44 is set, after which the flip-flop 44 is reset and the gate 41 is closed to terminate the counting cycle. The time interval which elapses during the counting cycle is thus equal to the period of the clock pulses D multiplied by the number of such pulses registered, less one. That is, if the clock pulse signal D has a frequency of fd and a period of $$T_d = \frac{1}{f_d},$$

the time interval $T_b$ of a counting cycle is essentially equal to $T_d(N-1)$.

As a concrete example, if the standard intervals $T_b$ are desirably to be made 0.005 seconds in duration (in keeping with the example of $f_s = 100$ Hz. stated above), the counter 42 may be chosen and constructed to include ten flip-flops 42a connected in tandem to provide a full "roll-over" count capacity of 1024. Starting at a zero count state, the counter must receive $2^{10}$ or 1024 input pulses before it rolls over again to a zero count state and produces a carry output response (0 to 1 level transition) from its last state. The time interval between the first and the last input pulse is 1023 times the period between the clock pulses fed to the input of the counter. Thus, to make the count cycle interval $T_b$ equal to 0.005 seconds, the period $T_d$ of the clock pulses is chosen to be:

$$\frac{.005}{1023} = .48875 \times 10^4 \text{ seconds}$$

The crystal oscillator 40 is thus designed and constructed to produce clock pulses at a frequency:

$$f_d = \frac{1}{T_d} = \frac{1}{.48875 \times 10^4} = 204.600 \text{ KHz.}$$

By changing either the number of counts per counting cycle or the frequency of the clock pulse source, the time period $T_b$ may be made to have any desired value, thereby to select the set point frequency $f_s$ (and the set point speed in a system like that of FIG. 1). The apparatus shown in FIG. 2 may, of course, be constructed with selector switches or rheostats (not shown) settable by an operator so as to change the counter capacity or the oscillator frequency, thereby making it possible to change the set point even when the equipment is in use in the field.

In the particular embodiment disclosed by FIG. 2, the counter starts at a predetermined reset count state of zero, and reaches a "full count" state of zero at the end of a counting cycle. Thus, the clearing action of the signal from the $\overline{Q}$ terminal of flip-flop 44 is redundant. It is not necessary, however, to construct the standard interval generator 35 in precisely the form illustrated by FIG. 2. On the contrary, the counter may be arranged so that it does not reach a full count roll-over during a counting cycle, but instead counts to a predetermined intermediate count value which is sensed and signaled by an appropriate decoder to reset the flip-flop 44 (and the flip-flop 46). The signal at the $\overline{Q}$ terminal of the flip-flop 44 may be fed back to the counter to set the latter to some preset count state other than zero, or to restore it to zero, as shown. In any event, the standard interval $T_b$ measured off during each counting cycle is determined jointly by (a) the clock pulse frequency $f_d$ and (b) the difference $N_c - N_r$ between the selected reset count state $N_r$ and the selected predetermined count state $N_c$ which is sensed in order to reset the flip-flop 44 and terminate the counting cycle.

To produce a recurring signal B of constant predetermined duration $T_b$, equal to the time measured off by each counting cycle, a second flip-flop 46 is coupled to be set by the first pulse which enters the counter 42. As here shown, the "set" input of flip-flop 46 as connected to receive the output F from the gate 41 so as to be set by the first positive-going wave front entering the counter 42 after the gate 41 is enabled. Succeeding pulses in the signal F merely try to set the flip-flop 46 again, but they have no effect on its state. Thus, simultaneously with the first pulse registered in the counter 42 at the beginning of a counting cycle, the flip-flop 46 is set, its terminal Q is switched from a 0 to a 1 voltage level, and one square wave of the timing signal B is initiated. When the counter 42 reaches a full count state and rolls over to zero content, the carry output signal from the last counter stage is applied to the clearing terminal c of the flip-flop 46, resetting the latter and causing the signal B to revert from a 1 to a 0 logic level. Thus, the recurring signal B is formed as a series of square waves each beginning substantially at the start of one of the signal A square waves (and at the start of a counting cycle), and ending after a predetermined time interval (e.g., 0.005 seconds) has been measured off.

In order digitally to subtract the signal A from the signal B (and the period $T_a$ from the period $T_b$), simple Boolean logic gating means 36 are employed to produce a first pulse when the signal B exists in the absence of the signal A, and to produce a second pulse when the signal A exists in the absence of the signal B. As here shown, the signal A is routed through an inverter 48 to an AND gate 49, and also directly to a second AND gate 50. The signal B is routed directly to the gate 49 and through an inverter 51 to the gate 50. The respective outputs of these gates are appropriately designated as pulses $\overline{A}.B$ and $A.\overline{B}$. The time widths of those pulses vary as discussed below with reference to FIGS. 3–5, but in essence the pulses $\overline{A}.B$ appear repeatedly with a width and duty cycle proportional to the frequency error when the frequency $f_a$ is above the set point $f_s$, and the pulses $A.\overline{B}$ appear repeatedly with a width and duty cycle proportional to the frequency error when the frequency $f_a$ is below the set point.

Finally, in carrying out the invention, means are responsive to the $\overline{A}.B$ and $A.\overline{B}$ pulses to produce an output signal which varies in polarity and magnitude according to the average of the difference between their respective time durations. First, the signals $\overline{A}.B$ and $A.\overline{B}$ when they exist, in the present example, are assumed to have logic 1 levels (positive voltages relative to a ground point of reference potential). Means are provided to create a composite signal C which represents the pulses $\overline{A}.B$ with a positive polarity and the pulses $A.\overline{B}$ with the opposite or negative polarity. As shown in FIG. 2 the pulses $\overline{A}.B$ and $A.\overline{B}$ are coupled to the gate electrodes of respective bipolar field effect transistors (FET's) 54 and 55. The two transistors have their source electrodes connected via equal resistors R1 and R1' to regulated, equal magnitude B+ and B– voltage sources, respectively. Their drain electrodes are connected via equal resistors R3 and R3' to the inverting input of an algebraic summing operational amplifier 56. When the gate electrode of one of those transistors is positive relative to ground, its source and drain form an essentially zero resistance conductive connection. Therefore, when the signal $\overline{A}.B$ is at a positive voltage or 1 logic level, the B+ voltage is transmitted via resistors R1 and R3 as an input signal to the amplifier 56. Similarly, when the signal $A.\overline{B}$ is at a positive or logic 1 level, the transistor 55 is conductive and the B– voltage is supplied by resistors R1', R3' as an input to the amplifier 56. The signal at C may thus be considered as constituted by both the $\overline{A}.B$ and $A.\overline{B}$ signals, the former appearing with a positive polarity and the latter appearing with a negative polarity —and in each case the absolute magnitude being the same.

The non-inverting input terminal of the amplifier 56 is returned via a resistor R5 to ground while the output terminal of that amplifier is connected through a resistor R6 to the inverting input, creating negative feedback. In order to filter, in effect, the output of the amplifier 56 so that it varies as the time average of its input signals, a capacitor C1 is paralleled with the resistor R6 to create integrating action.

Figure 4:
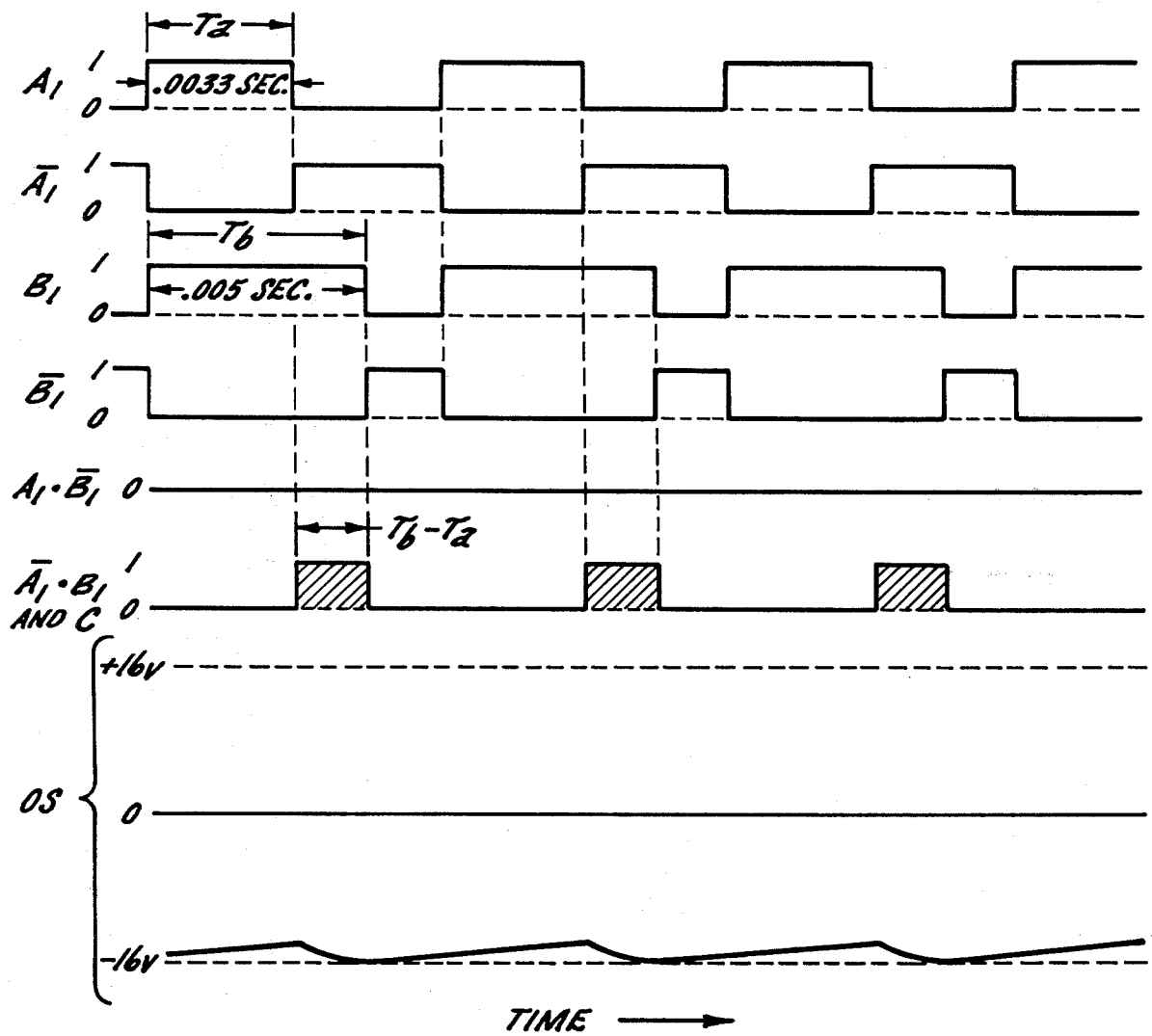
Figure 5:
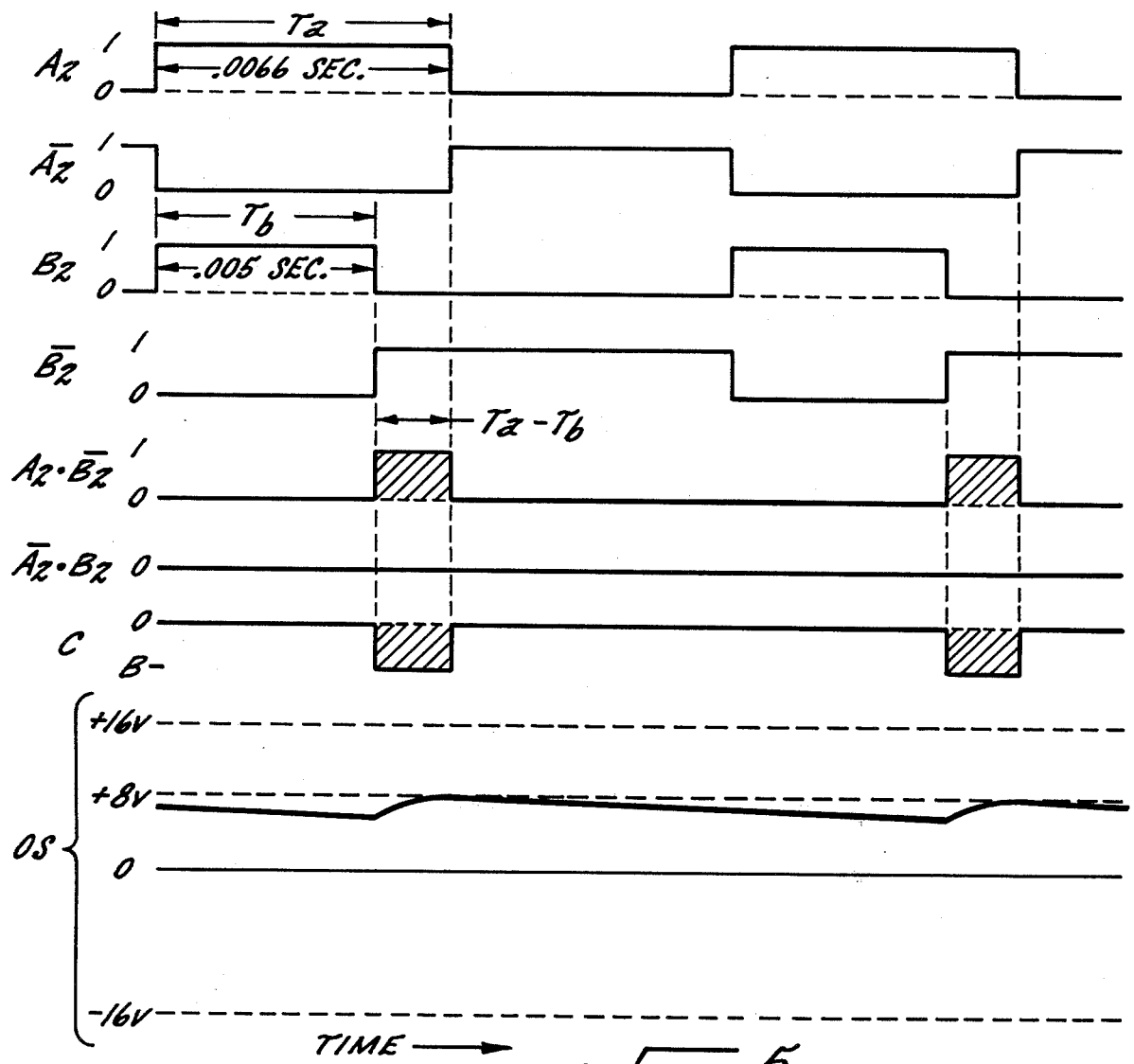

The operation of the error signaling circuit of FIG. 2 is made clear by the waveforms shown in FIGS. 3, 4 and 5. In FIG. 3, it is assumed that the recurring input signal A has a frequency precisely equal to the exemplary set point of 100 Hz. so that each square wave therein has a period $T_a$ equal to 0.005 seconds. As indicated by FIG. 3, when the leading edge of each square wave A appears, one square wave of the signal B begins. This occurs because the positive-going wave front of the square wave A sets the flip-flop 44 to switch the control voltage E to a 1 level and to enable the gate 41 so that the clock pulses D begin entering the counter 42. The first such clock pulse sets the flip-flop 46 so that the signal B square wave begins essentially in synchronism with the start of the square wave A. As noted above, each square wave B ends .005 seconds after it begins and because the periods $T_a$ and $T_b$ are equal (under the conditions assumed for FIG. 3) the A and B square waves end simultaneously. From inspection of FIG. 3 it will be apparent that at no time during successive A square waves and successive counting cycles do the signals $\overline{A}.B$ and $A.\overline{B}$ exist. Thus, so long as the frequency of the input signal A is equal to the set point frequency, the FET's 54 and 55 are not turned on, the net signal at C is zero, and the output signal OS from the amplifier 56 remains at zero.

In FIG. 4, by contrast, it is assumed that the input signal A (here labeled $A_1$) has a frequency of 150 Hz. (50% higher than the set point of 100 Hz.), so that the period $T_a$ of each $A_1$ square wave is 0.0033 seconds. For the sake of completeness, the $\overline{A}_1$ signal is also shown in FIG. 4. Further, and in keeping with what has been said above, FIG. 4 shows that each of the recurring standard interval square waves in the signal B begins substantially at the instant when the signal A square wave starts. But each such timing signal square wave (here labeled $B_1$) endures for 0.005 seconds, as explained above. Also for completeness in FIG. 4, the signal $\overline{B}_1$ has been illustrated simply as the inversion of the signal $B_1$. Inspection of FIG. 4 will confirm that at no time do the signals $A_1$ and $\overline{B}_1$ exist simultaneously. But on the other hand, the signal $\overline{A}_1.B_1$ appears during the latter portion of the $B_1$ square waves because the $A_1$ square waves are shorter in duration. Thus, the signal $\overline{A}_1.B_1$ as shown in FIG. 4 causes the FET 54 in FIG. 1 to turn on periodically for a time interval equal to the difference between $T_b$ and $T_a$. In effect, the $\overline{A}_1.B_1$ pulses appear as a positive signal C at the input of the amplifier 56. Because of the integrating or averaging effect of the capacitor C1 in the amplifier feedback circuit, the output signal OS of the amplifier varies as the time average of the pulses $\overline{A}_1.B_1$—but because of the inverting action of the amplifier, the output signal OS is a dc. voltage which is approximately equal to –16 volts. The output signal OS has slight ripple, greatly exaggerated in FIG. 4, due to slightly imperfect filtering.

In FIG. 5, it is assumed that the incoming signal A has a frequency of 75 Hz. (25% below the assumed set point of 100 Hz.) so that the periods $T_a$ for the successive input signal square waves (here labeled $A_2$) are 0.0066 seconds. As in FIGS. 3 and 4, the standard interval time signal B (here labeled $B_2$) begins with the initiation of each square wave $A_2$ and exists for a period $T_b$ of 0.005 seconds. FIG. 5 makes it plain that, under these circumstances, the $\overline{A}_2.B_2$ pulses simply do not appear at the output of the AND gate 49. On the other hand, the $A_2.\overline{B}_2$ pulses appear at the instant each square wave $B_2$ ends and continue for a time interval until the corresponding A square wave ends. In consequence, the $A_2.\overline{B}_2$ pulses are in time equal to the difference between the periods $T_b$ and $T_a$. Moreover, those pulses periodically turn on the FET 55 (FIG. 2) so that a corresponding negative pulse labeled C in FIG. 5 is supplied to the input of the amplifier 56. Due to the inversion through the amplifier 56 and the averaging effect of the capacitor C1, the output signal OS from the amplifier is an essentially steady +8 volts except for filter ripple which is greatly exaggerated in FIG. 5.

Figure 6:
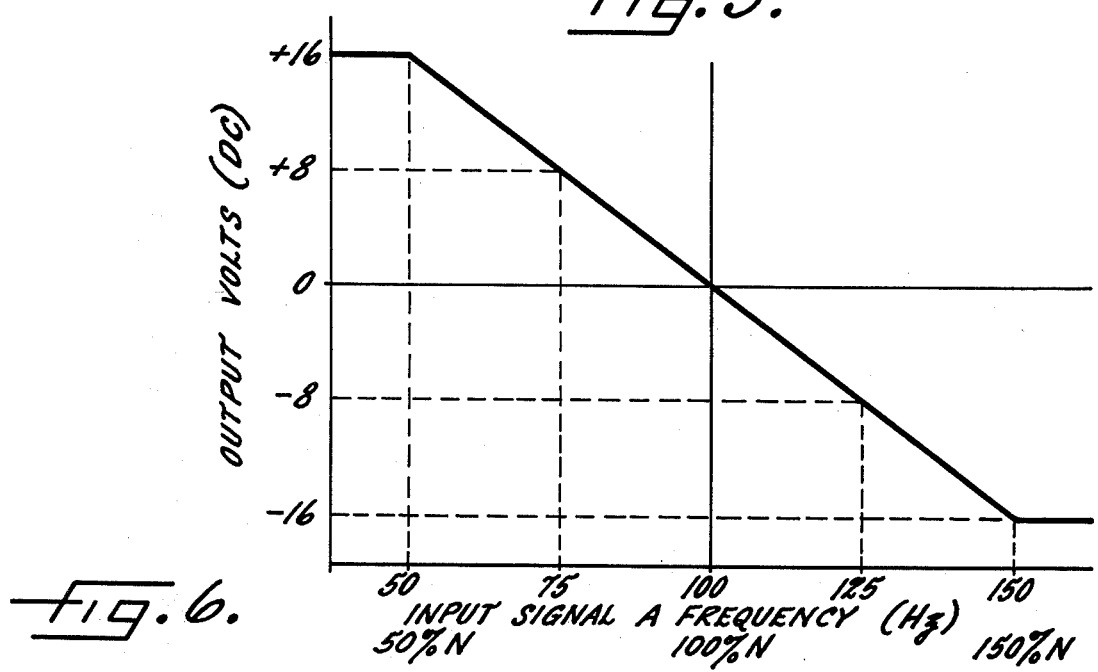
FIG. 6 is a graphical representation of the manner in which the final analog output signal in the apparatus of FIG. 2 varies as the sensed frequency signal changes in relation to the set point frequency.

The overall response characteristic of the error-signaling device shown in FIG. 2 is graphically illustrated by FIG. 6. As the frequency of the input signal A varies above or below the set point frequency of 100 Hz., the output signal OS becomes negative or positive and takes on a magnitude which is linearly proportional to the size of the frequency error. Because frequency errors involving departures of more than 50 percent of the set point are unlikely to be encountered, the gain of the amplifier shown in FIG. 2 is chosen such that the amplifier output saturates at its supply voltage level of +16 volts or −16 volts after the frequency error exceeds 50 percent. This limitation, of course, need not be imposed if a different gain is chosen or if greater supply voltages are used for the operational amplifier.

It may be observed from FIG. 4 (illustrating the case of a frequency error of +50%) that the duty cycle of the pulses $\overline{A}_1.B_1$ is:

$$\text{Duty Cycle} = \frac{T_b - T_a}{2T_a} = \frac{T_b}{2T_a} - 0.5 = T_b \cdot f_a - 0.5 =$$

$$.005 \times 150 - 0.5 = .75 - .5 = 25\%$$

By contrast in FIG. 5 (illustrating a frequency error of −25%), the duty cycle of the pulses $A_2.\overline{B}_2$ is:

$$\text{Duty cycle} = T_b f_a - 0.5 = 0.005 \times 75 - 0.5 =$$
$$0.375 - 0.5 = 12.5\%$$

The transfer function for the operational amplifier in FIG. 2 is:

$$E_{os} = (\text{Duty Cycle})(B+ \text{ or } B- \text{ Voltage})(\text{Gain})$$

Noting the above expressions for the duty cycle, the response or output of the error signaling circuit as a whole may thus be expressed:

$$E_{os} = (T_b \cdot f_a - 0.5)(B\pm) \frac{R6}{R1 + R3} \cdot \frac{1}{(R6 \cdot C_1)^{s+1}}$$

The differential operator $s$ appearing above expresses the integrating or filtering action of the capacitor C1. It may be seen, therefore, that the system of FIG. 2 provides a final error signal in the form of a dc. voltage $E_{os}$ which is proportional to the frequency error or departure from the chosen set point (determined by the selected time interval $T_b$), and with a proportionality factor which is selectable or changeable by adjusting the gain of the final amplifier 56. Moreover, the present device operates with a time constant determined essentially by resistor R6 and capacitor C1. The ripple in the final output signal OS (shown with exaggeration in FIGS. 4 and 5) is generally proportional to the frequency error. This means that in the region of very small or zero frequency errors where it may be critical for exact control purposes, the ripple becomes essentially negligible.

A. A Deadband Embodiment

In some (but by no means all) applications of the present invention, it may be desirable to desensitize the frequency error detector (while nevertheless retaining a fairly high gain factor) so as to avoid needless "jitter" and corrective action when the frequency error is small. For this purpose, a deadband characteristic may be created in the response obtained by the present method and apparatus. Such a deadband is obtained by modification to the apparatus of FIG. 2, as shown in FIG. 7.

Figure 7:
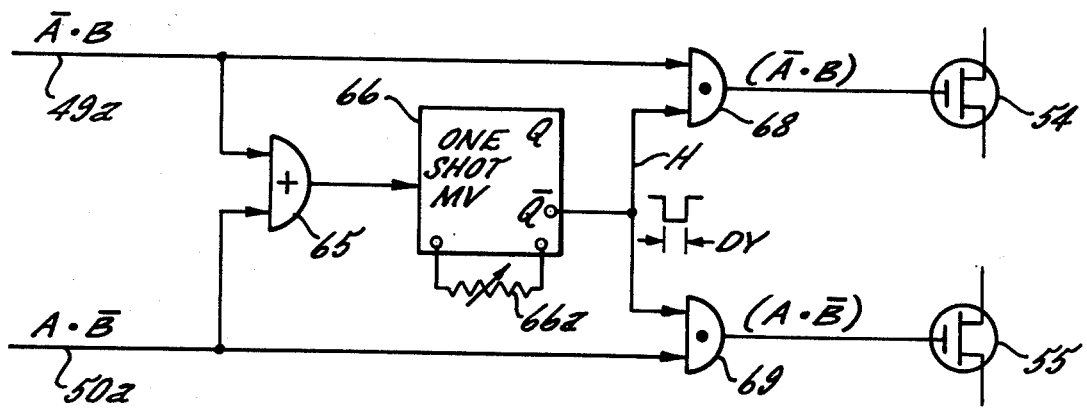
FIG. 7 is a fragmentary illustration of a system like that shown in FIG. 2 but modified to produce a deadband characteristic in the final output signal.

FIG. 7 shows supplemental circuit components added between the gate output lines 49a and 50a and the gate electrodes of the FET's 54 and 55 in FIG. 2. The added components constitute a means for blocking the first or second pulses $\overline{A}.B$ or $A.\overline{B}$ for a preselected time interval measured from the leading edges of those pulses. To do this, those two pulses fed to the inputs of an OR circuit 65 whose output is coupled to a delay generator here shown as a one-shot multivibrator 66. The $\overline{Q}$ output terminal of the latter is connected to one input of each of two AND gates 68 and 69, the second input of each such gate receiving the $\overline{A}.B$ and $A.\overline{B}$ pulse signals as they are generated and as they appear in FIG. 2 on conductors 49a and 50a. The outputs of the AND gates 68 and 69 therefore carry modified pulse signals which are designated here in parentheses $(\overline{A}.B)$ and $(A.\overline{B})$. These modified signals are, as shown in FIG. 7, supplied to the gate electrodes of the FET's 54 and 55. Except as noted and as shown in FIG. 7, the modified device is constructed according to the diagram of FIG. 2.

Whenever a positive-going wave front is supplied to the input terminal of the one-shot multivibrator 66, the latter switches to its "set" or 1 state, and then automatically resets after elapse of a predetermined delay interval here called DY. The delay interval is established by an R–C timing circuit in the multivibrator 66, and an external rheostat 66a shown in FIG. 7 permits a user of the equipment to adjust the time constant of that R–C circuit. When the one-shot multivibrator switches to its set state, the voltage H at the $\overline{Q}$ output terminal switches from a 1 to 0 logic level; that voltage restores to a 1 level after the delay interval DY. Thus, one may visualize that the gates 68 and 69 are normally enabled by the control signal H from the multivibrator 66, and will normally pass their input signals $\overline{A}.B$ and $A.\overline{B}$. However, when either one of those signals appears on line 49a or 50a, it passes through the OR circuit 65 to trigger the multivibrator 66, thereby disabling both of the gates 68 and 69 until the delay interval DY expires. This means that unless the signal $\overline{A}.B$ or $A.\overline{B}$, when it exists, has a duration greater than the delay interval DY, such signals are totally blocked by the gates 68 and 69. To the extent that one of the signals $\overline{A}.B$ or $A.\overline{B}$ has a duration longer than the chosen delay interval DY, the terminal portion of that signal (following the expiration of the delay DY) will be transmitted by one of the gates 68 or 69 to the corresponding FET 54 or 55.

Figure 8:
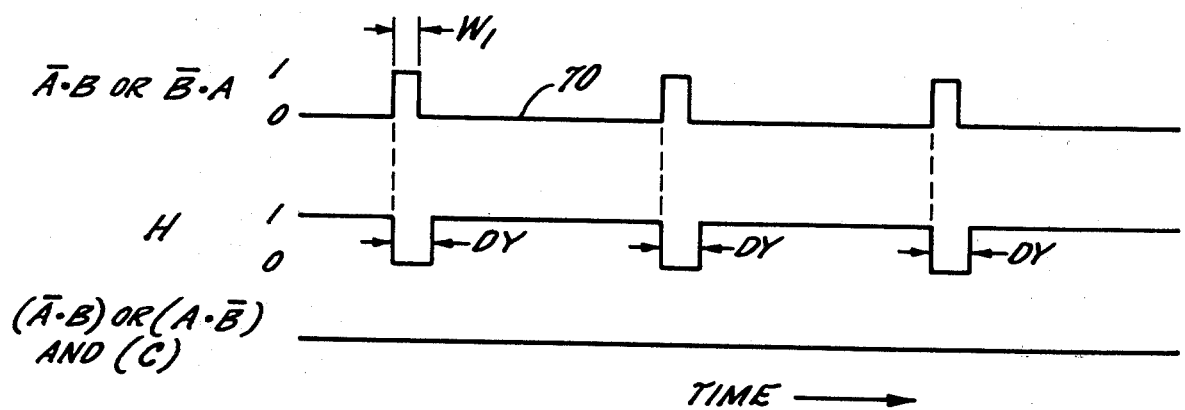
FIGS. 8 and 9 are graphical waveforms, plotted against time, which illustrate the variations in certain signals during operation of apparatus constructed according to FIGS. 2 and 7, and specifically under conditions such that the error does or does not exceed a predetermined deadband.
Figure 9:
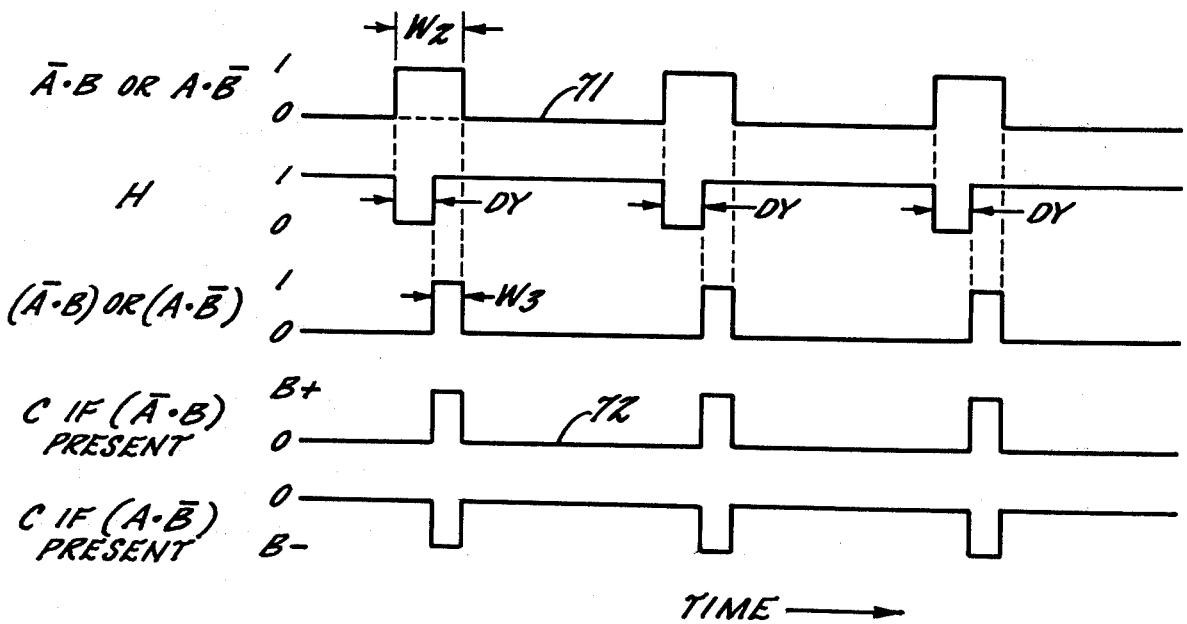

The resulting operation of the apparatus illustrated by FIG. 7 taken with FIG. 2 is made clear by the waveforms shown in FIGS. 8 and 9. In FIG. 8, the waveform 70 represents either the $\overline{A}.B$ or $A.\overline{B}$ signal appearing with a certain repetition rate and having a time width $W_1$. The leading edge of each pulse in the waveform 70 passes through the OR gate 65 to trigger the multivibrator 66 so that the signal H from the $\overline{Q}$ terminal switches from a logic 1 to a logic 0 level at that instant and remains at the 0 level for the predetermined delay interval DY. Since in FIG. 8 the pulse width $W_1$ is relatively small (indicating a relatively small frequency error) and less than the delay interval DY, the pulses shown in the waveform 70 are totally blocked by the gate 68 or 69 in FIG. 7. Thus, even though there is a small speed error, the added components shown in FIG. 7 prevent any conduction of the FET's 54 and 55. The signals $(\overline{A}.B)$, $(A.\overline{B})$, the net input signal C to the amplifier 56, and the output signal OS all remain zero.

On the other hand, FIG. 9 illustrates the operation of the deadband embodiment (shown by FIG. 7 taken with FIG. 2) when the frequency error exceeds the selected deadband. A waveform 71 represents either the signal $\overline{A}.B$ or $A.\overline{B}$ and consists of periodic pulses having a time width $W_2$. As before, the signal H provided by the one-shot multivibrator 66 falls to a 0 logic level at the start of each pulse in the waveform 71, and restores to a 1 logic level after a delay interval DY. Therefore, the gates 68 and 69 are closed to block the $\overline{A}.B$ or $A.\overline{B}$ pulses during the intervals DY but are reopened to pass shortened or modified pulses $(\overline{A}.B)$ or $(A.\overline{B})$ having a width $W_3$. If it is the $(\overline{A}.B)$ pulses which are present, these constitute, in effect, a positive input C to the amplifier 56. Since they are positive in polarity, the output signal OS from the amplifier will be a negative dc. voltage which in magnitude is proportional to the average value of the pulses (and proportional to the width $W_3$) shown by waveform 72 in FIG. 9. On the other hand, if the input signal C is produced by modified pulses $(A.\overline{B})$ transmitted by the gate 69 to the FET 55, the output signal OS of the amplifier 56 will be positive in polarity and proportional in magnitude to the average dc. value of those pulses.

Figure 10:
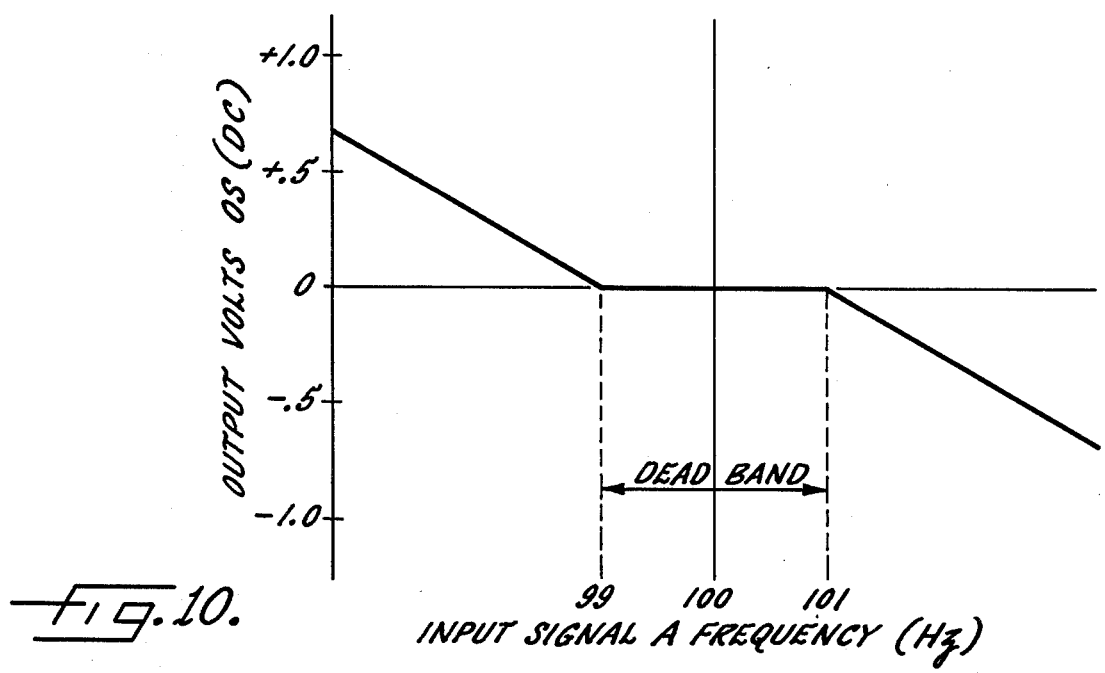
FIG. 10 is a graphical illustration of the way in which the final output signal, in the apparatus according to FIGS. 2 and 7, varies as the incoming signal frequency changes in relation to the set point frequency.

FIG. 10 illustrates the overall response characteristic of the deadband embodiment constituted by FIG. 7 taken with FIG. 2. As there shown, the output signal OS remains at zero as the frequency of the input signal rises to 101 Hz. or falls to 99 Hz. in relation to the set point frequency of 100 Hz. This deadband of ±1 Hz. is established by the blocking action of the gates 68 and 69 controlled by the one-shot multivibrator 66 in FIG. 7. Yet, when the frequency error is greater than 1 Hz., the output signal OS then increases (in a positive or negative direction) in proportion to the amount by which the frequency error exceeds the deadband. Of course, the width of the deadband may be increased or decreased by adjusting the length of the delay interval DY, and this is conveniently accomplished by resetting the rheostat 66a.

B. An Embodiment Providing Infinite Resolution

Figure 11:
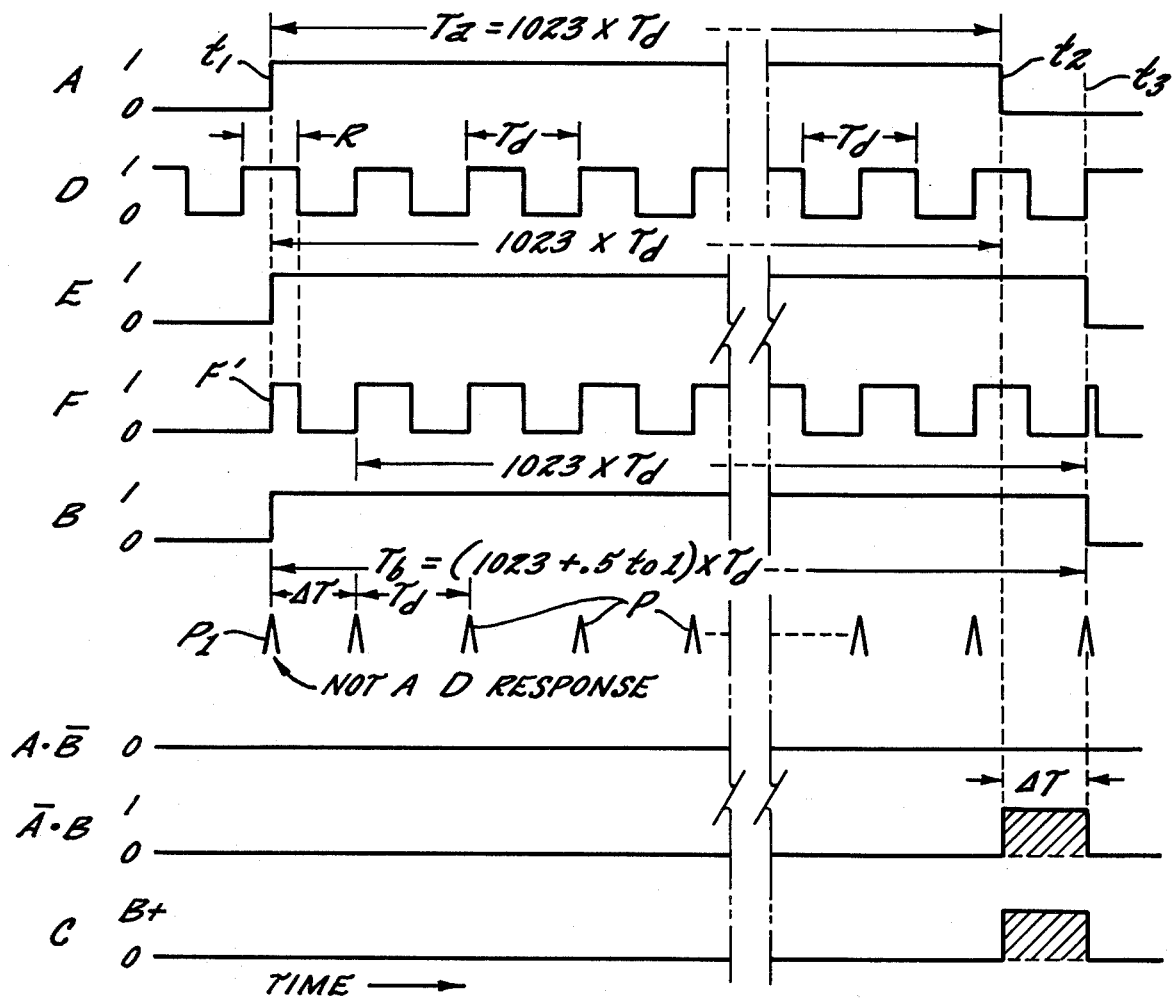
FIG. 11 is a series of waveforms, plotted against time, illustrating inaccuracies which may arise in the operation of the apparatus shown by FIG. 2 due to the finite, least-increment resolution of the digital apparatus involved.

FIG. 11 shows the waveforms of various signals as they exist during operation of the apparatus illustrated in FIG. 2, but on an expanded time scale so that one may understand a problem which may arise. As will be noted below, the time interval $T_b$ may turn out to be inaccurate to a small but appreciable degree unless a preferred and novel modification in the standard interval generator is incorporated. But when such modification is adopted, the limited resolution of the error signaling apparatus is avoided, and infinitely fine resolution is achieved.

As shown in FIG. 11, it is assumed that the input signal A has square waves of durations $T_a$ which are exactly 0.005 seconds in duration and which —according to the example given above —reflect that the input signal has the desired set point frequency of 100 Hz. For the apparatus to function with high accuracy as intended and described above, therefore, the timing signal square wave B should have a uniform, constant duration of 0.005 seconds. As explained by way of example above, the square waves B of such duration are measured off by registering 1024 counts in the counter 42 which responds to the output F of the gate 41 each time the latter is enabled by the signal E from the flip-flop 44. When 1024 counts are registered, one normally assumes that the time elapsed during the counting cycle is 1023 × $T_d$, where $T_d$ is the period of the clock pulse signal D to which the gate output F identically corresponds whenever the gate 41 is enabled. That assumption, however, is not justified and the duration of the timing square waves B may depart from being exactly equal to an integral multiple (here, for example, 1023) of the clock pulse period $T_d$.

Observe the circumstances shown in FIG. 11 where the input signal square wave A begins at a time instant $t_1$. That instant falls, in the case illustrated, mid-way during a short time interval when the clock pulse signal D is at a logic 1 level. Neglecting the very short switching times for the flip-flop 44, the gate 41, and the flip-flop 46 (FIG. 2), one sees that the flip-flop 44 is set and its gate control signal E switches from a 0 to a 1 logic level at the instant $t_1$. The gate 41 is thus enabled at the instant $t_1$ when the input signal D to that gate resides at a logic 1 level. Therefore, the gate output signal F immediately switches from a 0 to a 1 level at the instant $t_1$ and thereafter switches between the 0 and the 1 level in synchronism with the clock pulse signal D. At the instant $t_1$, however, when the gate output signal F undergoes 0 to 1 transition, the positive-going wave front in the signal F causes (i) registration of the first count in the counter 42, and (ii) setting of the flip-flop 46 so that the timing signal square wave B begins (i.e., switches from a 0 to a 1 level). Therefore, the standard time interval signal B begins at the instant $t_1$ and in precise synchronism with the start of the input square wave A —but the signal B does not start in synchronism with a transition (0 to 1 and 1 to 0) in the clock pulse signal D.

With the above-stated assumption that the input signal square waves A are exactly 0.005 seconds long, it may be concluded that the square wave A terminates after a duration of 1023 × $T_d$ (where $T_d$ is the clock pulse period) at an instant here labeled $t_2$. At the instant $t_2$ (which is later than instant $t_1$ by an integral number of cycles of the clock pulse signal D) the signal D is residing at a logic 1 level. The counter 42 will be holding a count of 1023 and is ready to roll over to the zero count state and produce a carry output response when the next positive-going wave front is applied to the counter input. But the next positive-going transition in the signal D and the signal F occurs at a later instant in time labeled $t_3$ in FIG. 11. The carry response from the counter clears the flip-flops 44 and 46 to terminate the timing square wave B at the instant $t_3$. Therefore, while the standard timing interval desired for the signal B should be 0.005 seconds or exactly 1023 × $T_d$ seconds, it turns out in this case to be 1023.75 × $t_d$. Thus, the period $T_b$ is greater in length than the period $T_a$ by the time labeled ΔT even though under the assumed conditions $T_a$ and $T_b$ should have equal durations. As indicated by FIG. 11, the signal B exists in the absence of the signal A for the interval ΔT, and the signal $\overline{A}.B$ appears during the time ΔT at the output of gate 49 (FIG. 2). This turns on FET 54 and creates a corresponding positive input voltage pulse at C, forming an input signal to the amplifier 56.

From this example, it may be seen that the counter 42 responds to positive-going wave fronts at its input, and thus to 0 to 1 level transitions in the clock pulse signal D and the gate output signal F. These transitions are marked by carets P at coincidental instants in FIG. 11. Yet, the first such transition occurs simultaneously with the caret $P_1$ which is not created by and does not coincide in time with a 0 to 1 level transition in the signal D. Thus, the first count registered at the instant $P_1$ is a "false count" which does not correspond to and coincide with a level transition in the clock pulse signal D. Under the condition of zero frequency error, therefore, and when the signals $A.\overline{B}$, $\overline{A}.B$ and C and OS all should be zero, the signals $\overline{A}.B$, C and OS have small finite values which constitute inaccuracies in the detection of the frequency error.

This anomaly arises because the input signal A may occur randomly in time relative to the positive-going wave fronts of the higher frequency clock signal D. If the leading edge of the stimulating square wave A appears at any time when the signal D is partially enabling the gate 41, then the leading edge of the coincident control signal E causes a transition F' in the signal F which is registered as the first count in the counter 42. The "tolerance" for this false count (which occurs not in response to a level transition in the clock pulse signal D) to exist is the time range R shown in FIG. 11. The first false count may thus appear, and the signal B be initiated, from one-half to one period $T_d$ before the next positive-going transition in the clock signal D and the gate output signal F. The timing error $\Delta T$ in the interval $T_b$ is therefore not fixed or known because it depends upon the random timing of the leading edge wave front of the signal A relative to the higher frequency clock pulse signal D. The total standard time interval $T_b$ reflected by the signal B may thus have a duration of $1023 \times T_d + 0.5$ to 1.0 clock pulse periods $T_d$. The false signal $\overline{A}.B$ can have a width $\Delta T$ which varies from 0.5 to 1.0 times the period $T_d$, and thus may create a small inaccuracy of unknown magnitude in the dc. output signal OS. Because this random relationship between the start of each square wave A and the clock signal D exists, the resolution of the system shown in FIG. 2 is limited to the nearest interval $T_d$ in the worst case, and the resulting inaccuracy in the signal OS will appear whether or not the input frequency $f_a$ is or is not equal to the set point value.

In accordance with an important aspect of the present invention such possible inaccuracy is avoided by means and operational steps which assure that the first wave front sent to the counter and registered therein to begin a counting cycle (and which also sets the flip-flop 46 to start the square wave B) results from a level transition of a predetermined direction (0 to 1 or 1 to 0) in the clock pulse signal D, rather than from a signal level transition in the enabling control signal E applied to the gating means 41. Because the counting cycle and the square wave B always terminate simultaneously with a level switching transition of the clock signal which is of the predetermined direction that causes registration of a count after the gate 41 has been enabled, the period $T_d$ is always exactly the same integral multiple of the clock pulse period $T_d$.

Figure 12:
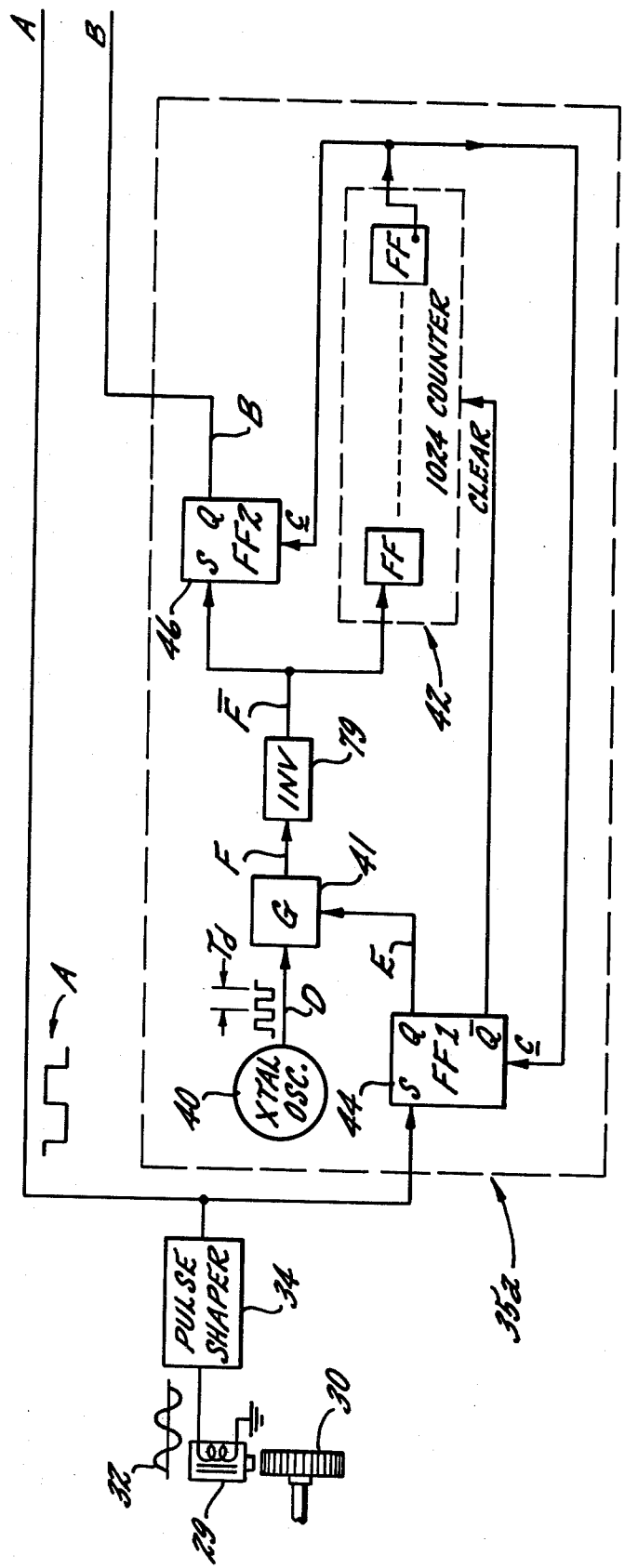
FIG. 12 is a block diagram of apparatus corresponding to a portion of FIG. 2 but incorporating modifications to provide infinite resolution in the response of the apparatus.

More explicitly and with reference to the exemplary, modified embodiment shown in FIG. 12, the counter 42 (and the flip-flop 46) respond to wave fronts of a predetermined direction applied to their inputs. That predetermined direction is here assumed to be a 0 to 1 level transition. The gating means represented by the AND gate 41 receives the clock pulse signal D and is controlled by the signal E from flip-flop 44 which swings to a 1 level when the leading edge of the input signal A appears. As a means to assure that the first signal transition in a 0 to 1 direction at the input of the counter results from a switching transition in the clock pulse signal D (rather than a switching transition in the gate-control signal E), an inverter 79 is incorporated into the means for coupling the output of the gate 41 to the inputs of the counter 42 and the flip-flop 46. As a result, the gate 41 produces an output signal F but the counter 42 and the flip-flop 46 inputs receive the inverted counterpart $\overline{F}$ produced by the inverter 79.

When the leading edge of the input signal A appears and the flip-flop 44 is set to make the signal E switch to a 1 level and enable the gate 41, the gate output F may rise to a 1 level, but the inverter output signal $\overline{F}$ switches from a 1 to a 0 level and therefore produces no response in the counter 42 or the flip-flop 46.

Figure 13:
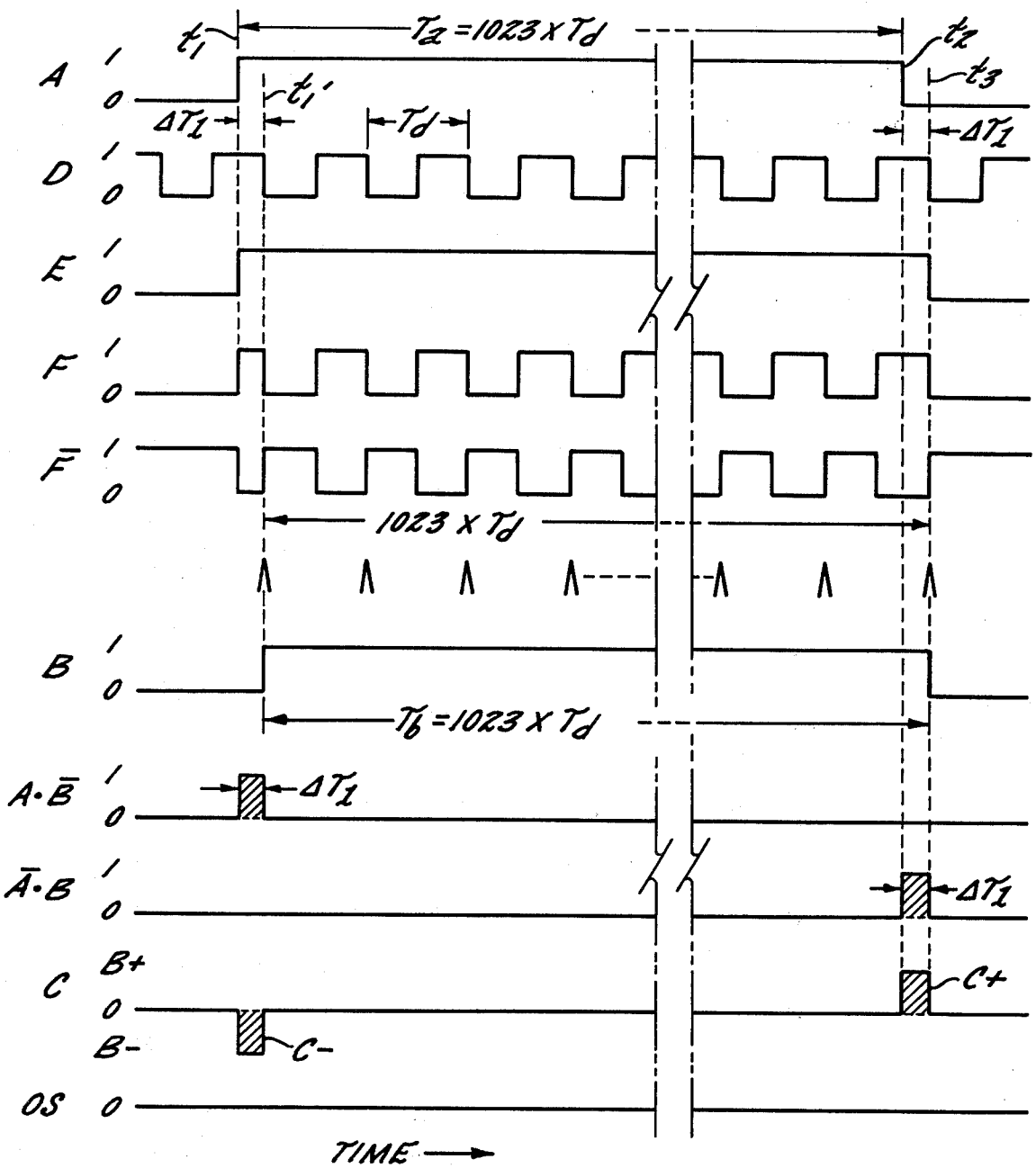
FIGS. 13, 14 and 15 are graphical waveforms, plotted against time, to illustrate variations in certain signals during operation of apparatus constructed according to FIG. 2 with the improvement illustrated by FIG. 12.
Figure 14:
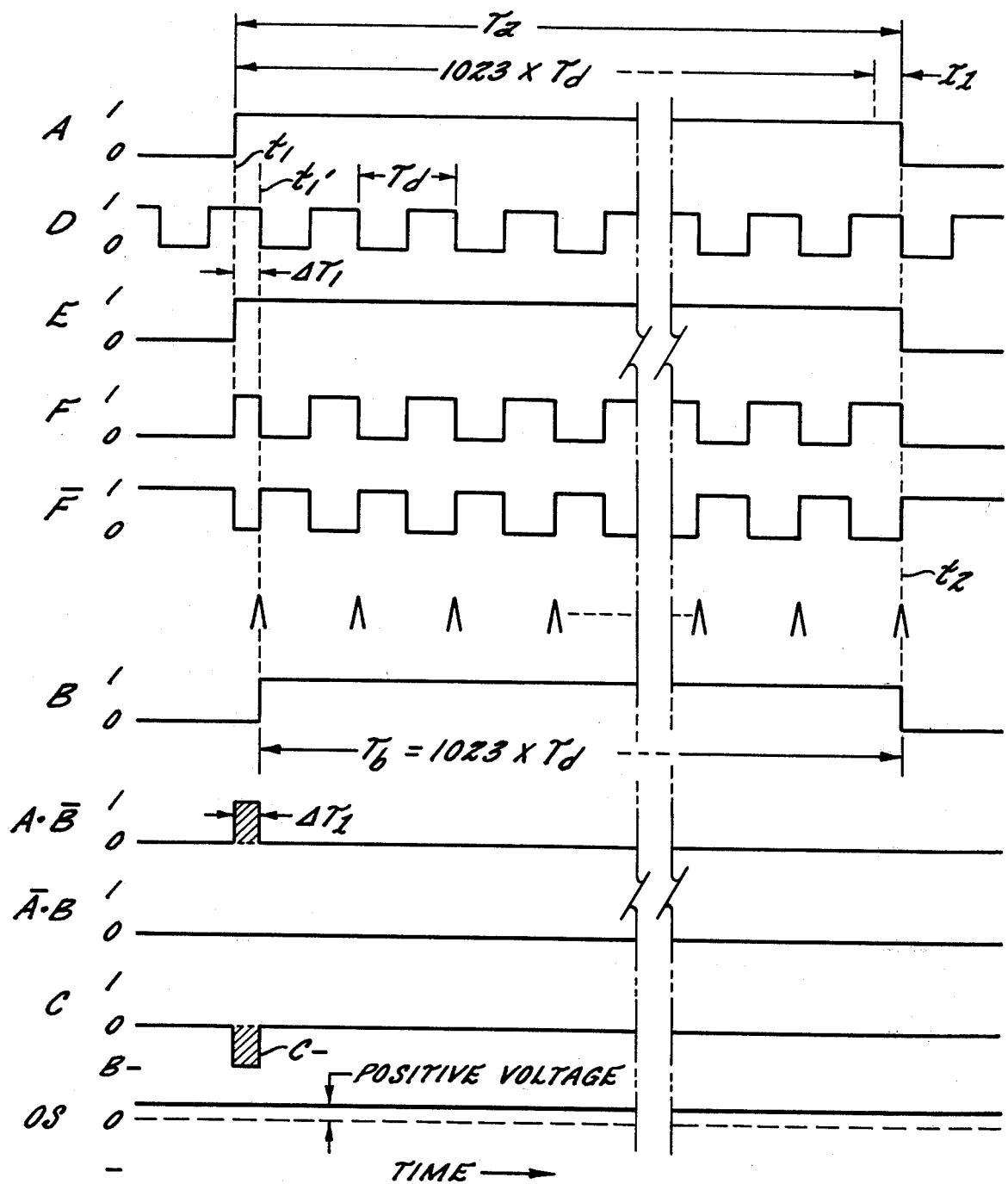
Figure 15:
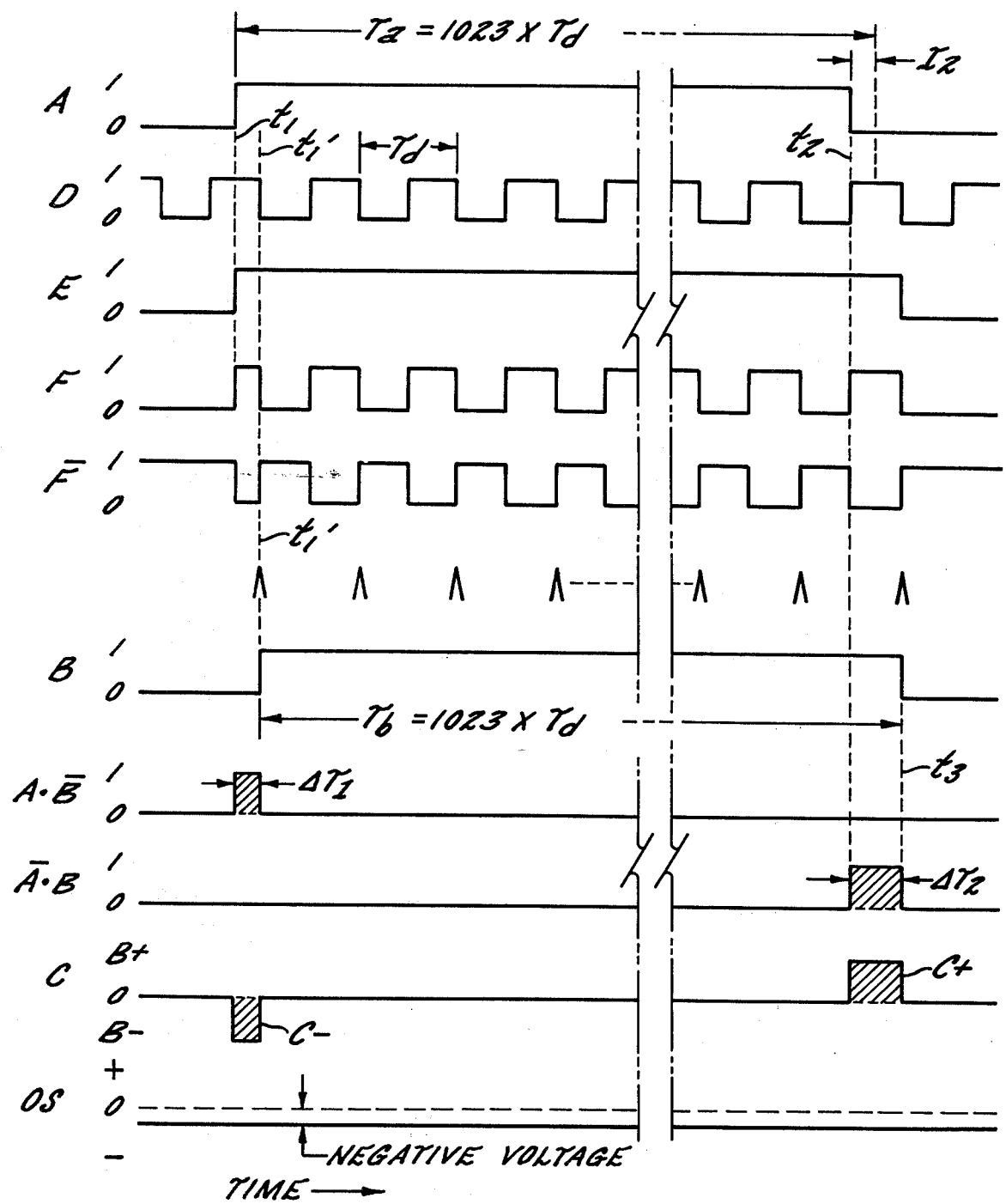

The operation of the modified embodiment of FIG. 12, and the yielded advantage of accurate, infinite resolution are made clear by the waveforms of FIGS. 13–15. In FIG. 13, it is assumed that the frequency $f_a$ of the input signal A is precisely in agreement with the set point frequency and that the frequency error is zero. This means that the period $T_a$ is in duration equal to $1023 \times T_d$ and should turn out to be precisely equal to the standard interval $T_b$ of the timing signal B. If, as shown in FIG. 13, the leading edge of the square wave A appears at instant $t_1$ when the clock pulse signal D is at a logic 1 level, the flip-flop 44 (FIG. 12) is simultaneously set and the signal E switches from 0 to a 1 level. Since both inputs to the gate 41 at this instant become logic 1 levels, the gate output signal F switches from a 0 to a 1 level, and the inverted signal $\overline{F}$ switches from a 1 to a 0 level. The positive-going transition in the signal F at instant $t_1$ (and which in FIG. 2 would produce a false initial count registration) thus results in a 1 to 0 transition in the signal $\overline{F}$. The latter neither creates the registration of a count in the counter 42 nor sets the flip-flop 46.

After the instant $t_1$, the next negative-going transition in the clock pulse signal D occurs at an instant $t_1'$. At the latter instant the gate output signal F falls from 1 to 0 and the inverter output signal $\overline{F}$ switches from 0 to 1. This latter positive-going wave front produces response by both the counter 42 and the flip-flop 46. The counting cycle and the square wave B are therfore initiated at the instant $t_1'$ and in synchronism with a negative-going transition in the clock pulse signal D. The counting cycle and the interval $T_b$ thus always start simultaneously with a negative-going transition in the clock pulse signal D even though the randomly-timed incoming signal A begins at some earlier instant $t_1$ when the clock pulse signal is at a 1 level.

After the instant $t_1'$, each subsequent negative-going transition in the clock pulse signal D produces a negative-going transition in the gate output signal F and a positive-going transition in the inverter output signal $\overline{F}$. These latter $\overline{F}$ transitions register as counts in the counter 42. Simultaneously with the appearance of the 1024th transition, the counter produces a carry output response to reset flip-flops 44 and 46, thereby terminating the counting cycle. Since the counting cycle terminates at an instant $t_3$ shown in FIG. 13, it occupies a total time $T_b$, and the square wave B exists for a period $T_b$, exactly equal to $1023 \times T_d$. That is, the time interval $T_b$ measured off and reflected by the standard time signal B is exactly an integral multiple of the clock pulse period $T_d$.

It is to be noted especially from FIG. 13 that while the signal A begins at instant $t_1$, the signal B begins at a slightly later instant $t_1'$. Therefore, the signal A exists in the absence of the signal B for a short interval $\Delta T_1$. With the signals A and B of FIG. 12 applied to the algebraic subtractor 36 shown in FIG. 2, the signal $A.\overline{B}$ will appear with a duration of $\Delta T_1$ between the instants $t_1$ and $t_1'$. On the other hand, under the stated assumption that the input square wave A has a period $T_a$ which corresponds to the input frequency $f_a$ having the set point value, the square wave A as shown in FIG. 13 terminates at an instant $t_2$ which is $1023 \times T_d$ later than the instant $t_1$. Because the instant $t_1'$ and $t_3$ are separated by an interval exactly equal to $1023 \times T_d$, the instants $t_2$ and $t_3$ are separated by the same time differential $\Delta T_1$. This means that the signal B exists in the absence of the signal A at the end of the counting cycle and for a short time interval $\Delta T_1$. Thus, the signals A and B as they appear in FIG. 12 and are applied to the subtractor 36 (FIG. 2) cause the signal $\overline{A}.B$ to exist for a short time interval $\Delta T_1$. The signals $\overline{A}.B$ and $A.\overline{B}$ thus create a net input signal C as shown in FIG. 13 consisting of opposite polarity pulses $C_-$ and $C_+$ of equal duration. Because the summing amplifier 56 algebraically adds the two parts of the signal C with filtering or averaging action, the final output signal OS remains zero. FIG. 13 therefore confirms that with the modification shown in FIG. 12, the inaccuracy due to the random time relationship between the beginning of the input square wave A and the clock pulse signal D does not arise. It is cancelled out by the appearance of the signals $\overline{A}.B$ and $A.\overline{B}$ for equal intervals $\Delta T_1$ at the beginning and at the end of a counting cycle.

FIG. 14, it is assumed that the incoming signal frequency $f_a$ is very slightly less than the set point value, so that the period $T_a$ is equal to $1023 \times T_d + I_1$. The operation of the apparatus shown in FIG. 12 (taken with FIG. 2) proceeds as described above. That is, if at the instant $t_1$ when the square wave A begins, the clock pulse signal D is at a 1 level, the gate control signal E rises to a 1 level and enables the gate 41. The gate output F therefore has a 0 to 1 level transition at instant $t_1$, and the inverter output signal $\overline{F}$ has a 1 to 0 transition which produces no response on the part of the counter 42 or the flip-flop 46. At a later instant $t_1'$ when the clock pulse signal D falls from the 1 to the 0 level, the signal F falls from 1 to 0, and the signal $\overline{F}$ rises from the 0 to the 1 level. This latter positive-going wave front produces a response in both the counter 42 and the flip-flop 46 so that the timing square wave B begins at instant $t_1'$. Since the first count in the counter is registered simultaneously with a negative-going transition at instant $t_1'$ in the signal D, the last count registered in the counter (and which terminates the signal B) occurs $1023 \times T_d$ later at instant $t_2$. Merely as an example of the random timing which may occur, it is assumed in the illustration of FIG. 14 that the input square wave A also terminates at the instant $t_2$. Thus, while the standard time interval signal B endures for precisely an integral multiple of the clock pulse $T_d$, the period $T_a$ of the incoming square wave A is slightly longer because the frequency $f_a$ is slightly less than the set point $f_s$.

As reflected in FIG. 14, the signal A exists in the absence of the signal B for a short time interval $\Delta T_1$ at the beginning of the counting cycle. Yet, the signals A and B both terminate at the instant $t_2$. In these circumstances, the signal $A.\overline{B}$ exists for a short interval $\Delta T_1$, but the signal $\overline{A}.B$ remains zero. The signal $A.\overline{B}$ solely creates the input signal $C_{31}$ (FIGS. 2 and 14) so that during each counting cycle the FET 55 is turned on for the period $\Delta T_1$, the input signal C during that period is negative in polarity, and the time-averaged output signal OS has a slight positive value as shown in FIG. 14. Therefore, even when the frequency error is very small and the frequency $f_a$ is less than the set point value, the output signal OS will correspond in polarity and magnitude to the sense and extent of the frequency error. One may visualize in FIG. 14 that if the interval $I_1$ (indicative of the frequency error) increases or decreases in size, then the magnitude of the dc. voltage OS will proportionally increase or decrease in magnitude.

Referring next to FIG. 15, the waveforms there shown are drawn with the assumption that the frequency $f_a$ of the incoming square waves A is slightly greater than the set point frequency. In other words, the period $T_a$ is equal to $1023 \times T_d$ less a short interval $I_2$. The square wave A begins at the instant $t_1$, but the counting cycle and the square wave B begin at a slightly later instant $t_1'$, as described earlier in connection with FIGS. 13 and 14. The standard interval signal B occupies a period $T_b$ which is precisely equal to an integral multiple of the clock pulse period $T_d$, i.e., $1023 \times T_d$ and ends at an instant labeled $t_3$ (when signal D has a negative-going transition and signal $\overline{F}$ has a positive-going transition). Since, under these assumed conditions, $T_a$ is less than $T_b$ and the input square wave A terminates at an earlier instant $t_2$, the signal $A.\overline{B}$ exists at the beginning of the counting cycle with a width $\Delta T_1$ but the signal $\overline{A}.B$ exists at the end of the counting cycle with a greater width $\Delta T_2$. That is, the signal B exists in the absence of the signal A between the instants $t_2$ and $t_3$ which determine the interval $\Delta T_2$. By comparing FIG. 15 with FIG. 13, it will be seen that the signal C in FIG. 15 consists of an initial negative pulse $C_-$ of duration $\Delta T_1$ and a subsequent positive pulse $C_+$ of duration $\Delta T_2$, where $\Delta T_2$ is greater than $\Delta T_1$. The FET 54 is turned on longer than the FET 55 during each counting cycle and the input signal at C is positive. Due to inversion in amplifier 56, the averaged final output signal OS is negative with an average dc. value proportional to the difference between the intervals $\Delta T_1$ and $\Delta T_2$. This confirms that as the incoming frequency $f_a$ rises slightly above the set point value established by the standard time interval $T_b$, the final analog signal OS becomes negative in polarity and yet has a value proportional to the frequency error.

From FIGS. 13-15, it is apparent the present system functions not only to eliminate inaccuracies which may result from a false initial count in the counter but also to provide infinitely fine resolution of the output signal in relation to small frequency errors. Where a system of high precision is desired to control speed or frequency, therefore, the present invention gives infinite resolution even though it functions with the accuracy and reliability of digital apparatus.

These benefits flow from the fact that the means for coupling the gate 41 to the counter 42 (FIG. 12) are selected and arranged so that the first registrable wave front of the counter input, to initiate a counting cycle, is created by a level switching in the clock pulse signal (rather than a level switching of the gate control signal). Viewed in a broader sense, the counter 42 and flip-flop 46 respond to a predetermined direction of level switching (here, for example, 0 to 1) at their inputs. After the gate 41 has been enabled and the counting cycle is in progress, each such switching in the predetermined direction at the counter input results from a given direction of level switching (here 1 to 0 as shown in FIGS. 13-15) of the clock pulse signal D. The gating means 41 taken with the coupling means represented by the inverter 79 constitute a means for causing the input to the counter 42 and the flip-flop 46 either to have no transition at all, or a transition opposite (1 to 0) to said predetermined direction at the instant of and as a result of the gate being enabled. In the example of FIG. 12, if the signals A and E begin at an instant when the signal D is at a 0 level, no transition appears at that instant in the gate output F or the counter input F̄. There is no response by the counter until the next following 1 to 0 transition in the signal D and the resultant 0 to 1 transition in the signal F̄. On the other hand, if the signals A and E begin at an instant when the signal D is at a 1 level (see FIGS. 13–15), the gate output F switches from 0 to 1 and the counter input F' switches from 1 to 0 at that instant. Again, there is no response by the counter until the next following 1 to 0 transition in the signal D and the resultant 0 to 1 transition in the signal F̄. Thus, each counting cycle and square wave B begins and ends in synchronism with a 1 to 0 transition of the clock signal D so that the period $T_b$ is an integral multiple of the clock period $T_d$.

Many different specific logic circuit configurations may be adopted to secure these beneficial results. For example, in FIG. 12 the same benefits may be achieved by constructing the counter 42 and the flip-flip 46 so that they respond to a negative-going transition (1 to 0), and by omitting the inverter 79. The apparatus would be like that shown in FIG. 2, except that the counter 42 and flip-flop 46 would respond to negative-going wave fronts at their inputs. As a second alternative, the gate 41 and the inverter 79 (as they appear in FIG. 12) may be constituted by a single NAND gate of common, known construction. As a third alternative, the apparatus of FIG. 12 may be modified by replacing the gate 41 with a common NOR gate but supplying the gating control signal E from the Q̄ terminal of flip-flop 44, and retaining the inverter 79 in the location shown. Such a NOR gate might be employed with the inverter 79 omitted if the counter 42 and flip-flop 46 are constructed to respond to negative-going wave fronts. Indeed, any combination of AND, NAND or NOR logic may be adopted, and with varying numbers of inversions between the oscillator 40 and the gate 41, or between the gate 41 and the counter input, so long as the wave front of the gate control signal produces at the counter input either no signal transition or a signal transition in a direction opposite to the predetermined transition direction to which the counter responds.

As the square wave A occurs repeatedly with a given constant period $T_a$, but shifts in its random timing relative to the clock pulse signal D, the time average of the pulses $C_-$ and $C_+$ remains the same, because even though the pulse width $\Delta T_1$ (FIG. 13) of each of those pulses increases or decreases, they change by the same amount and the changes algebraically cancel in the operational amplifier 56. But as the incoming signal frequency $f_a$ changes to make the periods $T_a$ vary over a range of one clock pulse period $T_d$, the two pulses Ā.B and A.B̄ will differentially vary in their widths, so that their algebraic combination in the amplifier 56 causes the output signal OS to vary with infinite resolution as small changes in the frequency error occur.

The frequency error signaling circuit here described brings to the art a simple and reliable device which is accurate because of its digital nature and yet which avoids the limited resolution of digital devices. It may be constructed with a deadband characteristic (FIG. 7 taken with FIG. 2) to mask out small or minor frequency errors, or by contrast it may be constructed with high gain in the final amplifier and infinite resolution to respond faithfully to very minute frequency errors.

I claim:

1. The method of producing a bipolar signal representing the analog of the error between a changeable frequency input signal and a set point frequency, comprising
    a. generating a first recurring signal [A] with each recurrence having a duration which varies inversely with changes in the frequency of the input signal,
    b. generating a second recurring signal [B] of constant predetermined duration, each cycle of such signal beginning substantially in synchronism with the start of each cycle of said first signal,
    c. producing a first pulse of predetermined amplitude and of one polarity whenever and so long as the first signal exists without the presence of the second signal,
    d. producing a second pulse of said predetermined amplitude and of the opposite polarity whenever and so long as the second signal exists without the presence of the first signal, and
    e. producing an output analog signal which varies as the time average of the algebraic sum of said first and second pulses.

2. The method of producing a bipolar error signal representing the analog of the error between a changeable frequency of an input signal and a set point frequency, wherein said input signal is a recurring squarewave A with the duration of each square pulse therein variable inversely according to changes in the frequency of the input signal, said method comprising
    a. generating a standard interval signal constituted by successive squarewaves B each of which begins substantially in synchronism with the start of each of said square pulses in said input signal, and each of which is of a predetermined time duration,
    b. utilizing said input and standard signal to
        b1. produce a first pulse whenever and so long as the standard signal is present annd the input signal is absent, and
        b2. produce a second pulse whenever and so long as the input signal is present and the standard signal is absent, and
    c. utilizing said first and second pulses to produce an output signal which varies in polarity and magnitude according to the sign and the size of the difference between the time durations of said first and second pulses.

3. The method set forth in claim 2 wherein said step a. includes the following sub-steps:
    a1. admitting pulses from a precise frequency source into a preset counter starting substantially at the instant each squarewave in the input signal begins,
    a2. starting a squarewave in said standard signal substantially at each of the last-named instants, and
    a3. in response to the counter reaching a predetermined number content, terminating the said admitting of said pulses and terminating the squarewave in said standard signal.

4. The method set forth in claim 3 wherein said step (b) includes the following steps:
    bi. applying said input signal squarewaves and the inversion of said standard signal squarewaves to a logical AND circuit to produce said first pulses during periods when A.B̄, and
    bii. applying the inversion of said input signal squarewaves and the standard signal squarewaves to a logical AND circuit to produce said second pulses during periods when $\overline{A}.B$.

5. The method set forth in claim 3 wherein said step (c) includes:
   c1. applying said first and second pulses with opposite polarity efect to the input of an algebraic summing amplifier, and
   c2. filtering the output of the amplifier to produce a signal which varies as the time average of the difference between the durations of the first and second pulses.

6. In apparatus for producing an analog signal representing the error between a set point frequency and the variable frequency of a recurring event, the combination comprising:
   a. means for producing a first recurring squarewave signal having the frequency of said recurring event, with the time duration of each squarewave inversely proportional to such frequency,
   b. means for producing a second recurring squarewave signal with each squarewave therein beginning substantially in synchronism with the start of a squarewave in said first signal and having a predetermined, constant time duration,
   c. means responsive to said first and second signals for producing an output signal which varies in accordance with the sign and magnitude of the average of the difference of the two time intervals respectively during which (i) a first signal squarewave is present but a second squarewave is absent, and (ii) a second signal squarewave is present but a first signal squarewave is absent.

7. In apparatus for producing an analog signal representing the error between a set point frequency and a variable frequency, the combination comprising:
   a. means for producing a first periodic signal A recurring at the variable frequency and having successive periods of existence which in time duration are inversely proportional to such frequency,
   b. means for producing a second periodic signal B having successive period of existence of predetermined constant duration, each period of existence beginning substantially in synchronism with the start of a period of said first signal,
   c. means for producing a first pulse whenever and so long as said first signal exists in the absence of said second signal,
   d. means for producing a second pulse whenever and so long as said second signal exists in the absence of said first signal,
   e. means responsive to said first and second pulses for producing an output signal which varies in polarity and magnitude according to the average of the diffference between the time durations of said first annd second pulses.

8. The combination set forth in claim 7, wherein said element (b) includes:
   b1. a source of fixed frequency pulses, the frequency being at least several times greater than the frequency of said first signal within its expected range of variation,
   b2. a counter,
   b3. means responsive to the beginning of a period of existence of said first signal for (i) coupling said source to said counter and (ii) initiating a period of existence of said second signal, and
   b4. means responsive to said counter reaching a predetermined count for (i) de-coupling said source from said counter, (ii) terminating the period of existence of said second signal, and (iii) resetting the counter to a predetermined reset count.

9. The combination set forth in claim 7 wherein said elements (c) and (d) include:
   means for inverting said first and second signals A and B to produce signals $\overline{A}$ and $\overline{B}$,
   a first logic gate receiving the signals $\overline{A}$ and B and producing said first pulses when $\overline{A}.B$, and
   a second logic gate receiving the signals A and $\overline{B}$ and producing said second pulses when $\overline{A}.B$.

10. the combination set forth in claim 9 wherein said element (e) includes:
    e1. a summing operational amplifier,
    e2. means connecting said first and second pulses as constant amplitude, opposite sense inputs to said amplifier, and
    e3. means for causing the output of the amplifier to vary as the time average of the difference between its two inputs.

11. The method set out in claim 2 further including:
    b1'. blocking the first pulse for a predetermined time interval measured from its leading edge to create a modified first pulse which appears only when the original first pulse in time width exceeds said intervals,
    b2'. blocking the second pulse for a predetermined time interval measured from its leading edge to create a modified second pulse which appears only when the original second pulse in time width exceeds said interval, and
    c'. said step (c) is carried out by utilizing said modified first and second pulses.

12. The method set forth in claim 2 and further characterized in that said step (c) is carried out by utilizing modified first and second pulses, and including the added steps of:
    d. utilizing said first and second pulses to measure off a predetermined time delay interval beginning with the leading edge of each first or each second pulse,
    e. blocking off all or the initial portion of each first and second pulse during any such delay interval to create the modified first and second pulses which are utilized in said step (c).

13. In apparatus for producing an analog signal representing the error betweeen a set point frequency and the variable frequency of a recurring event, the combination comprising:
    a. means for producing a first recurring squarewave signal having the frequency of said recurring event, with the time duration of each squarewave inversely proportional to such frequency,
    b. means responsive to said first signal for producing a second squarewave signal with the beginning of each squarewave therein substantially coincident in time with the beginning of each squarewave in the first signal, and with each squarewave therein having a predetermined, constant time duration,
    c. means for producing a first pulse during intervals when a second signal squarewave is present but a first signal squarewave is absent except for a predetermined delay period at the beginning of each such interval,
    d. means for producing a second pulse during intervals when a first signal squarewave is present but a second signal squarewave is absent except for a predetermined delay period at the beginning of each such interval, and e. means responsive to said first and second pulses for producing an output signal which varies in polarity and magnitude according to the time average of the difference between the time durations of the first and second pulses.

14. The combination set forth in claim 7 further including f. means responsive to the leading edge of either said first pulse or said second pulse for measuring off a predetermined time delay period, and g. means for blocking the response to said means (e) to said first and second pulses while said delay period is being measured off, whereby said output signal has a deadband response and varies according to the average difference between the durations of said first and second pulses as shortened by the delay period.

15. The combination set forth in claim 13 wherein: said means (f) comprises a one-shot multivibrator receiving said first and second pulses and triggered by the leading edge of either of such pulses to be placed in a set state for said predetermined delay period, and said means (g) comprise logic gates interposed between said means (c) and (d) on the one hand and said means (e) on the other hand, said gates being controlled by a signal from said multivibrator to block transmission of said pulses so long as the multivibrator is in its set state.

16. In a method of measuring off repeated precise time intervals $T_b$, in response to each of successive stimulating input signals, which includes a. generating a recurring train of clock pulses at a precise frequency, such pulses forming a signal which periodically switches between 1 and 0 logic levels, b. gating said clock signals into a counter in response to each input signal until the counter has counted a predetermined number of its responses, said counter responding to wave front transitions of a predetermined direction (either 0 to 1 or 1 to 0) applied to its input, and wherein said method is characterized by the improvement of 1. coupling the gated clock pulses to said counter such that the first wave front of said predetermined direction appearing at the input of said counter when gating is initiated results from switching of the level in the clock pulse signal rather than from initiation of the gating action, whereby the time interval $T_b$ between the registration of the first count and the last count in said counter is always an integral multiple of the period of said clock pulses.

17. The method set forth in claim 16 further characterized by the step of:

producing a time interval signal which begins when the first count is registered in said counter and ends when the last count is registered in said counter.

18. The method set forth in claim 16 further characterized by the steps of:

terminating the gating when said counter reaches a predetermined count state, and resetting the counter to a predetermined reset state prior to the next initiation of the gating.

19. In a method of measuring off a precise time interval in response to a stimulating input signal, which includes:

a. generating a recurring train of clock pulses at a precise frequency, such pulses forming a signal which periodically switches between 0 and 1 logic levels, b. opening a gate to couple said clock pulses into a counter in response to each input signal, said counter responding and registering a count in response to a wave front transition of a predetermined direction (either 0 to 1 or 1 to 0) at the output of said gate, c. terminating the gating in response to the counter having registered a predetermined number of counts, and wherein said method is characterized by the improvement of:

coupling the gated clock pulses to said counter such that the first wave front of said predetermined direction, appearing at the output of said gate upon initiation of gating action, results from a switching of the level in the clock pulse signal, whereby the interval between the registration of the first and the last count in said counter is an integral multiple of the period of said clock pulses.

20. In a method off precise time intervals in response to successive stimulating input signals, which includes a. generating a recurring train of clock pulses at a precise frequency, such pulses forming a signal which periodically switches between 0 and 1 logic levels, b. initiating the enablement of a gate to couple said clock signals into a counter in response to each input signal, and continuing such gating until the counter has registered a predetermined number of counts, b1. said counter registering a count in response to a level transition in a predetermined direction (either 0 to 1 or 1 to 0) at the output of said gate, and said method being characterized in that 1. the step (b) of initiating the enablement of said gate is carried out to produce either no response or a level transition opposite to said predetermined direction if it occurs when said clock pulse signal exits at either a 1 or a 0 level.

21. In a system having a. a precision frequency source of clock pulses which form a signal periodically switching between 1 and 0 logic levels, b. a counter adapted to respond to and count wave fronts of a predetermined direction (0 to 1 or 1 to 0) applied to its input, c. gate means, enabled by each one of a succession of input signals which arrive with lower frequency and in random, non-synchronized relation to said clock pulses, for transmitting said clock pulses to the input of said counter, d. means responsive to the counter reaching a predetermined count state $N_c$ for disabling said gate means, and e. means for resetting said counter to a predetermined reset state $N_r$ prior to the next enablement of said gate means, whereby the time interval $T_b$ measured off between the start and the end of each counting cycle is approximately constant and determined by the frequency of said source and the difference ($N_c - N_r$) between said predetermined count and reset states, the improvement comprising means responsive to each input signal for enabling said gate means at an instant such that the input to said counter next undergoes a wave front transition of said predetermined direction only as a consequence of a level switching in the clock pulse signal, whereby said time interval $T_b$ is precisely constant for all counter cycles and is always an integral multiple of the period of said clock pulses.

22. In a precise standard time interval generator having a. a precision frequency source of clock pulses which form a signal periodically switching between 1 and 0 logic levels, b. a counter adapted to respond to and count wave fronts of a predetermined direction (either 0 to 1 or 1 to 0) applied to its input, c. means including a gate for transmitting said clock pulse signal to the input of the counter, said gate being enabled or disabled by a 1 or 0 level in a control signal applied thereto, d. means responsive to the counter reaching a predetermined count for switching said control signal from a 1 to a 0 level and disabling said gate, and e. means responsive to an input signal, which may appear in random, non-synchronized relation to said clock pulses, for switching said control signal to a 1 level to enable said gate, the improvement characterized in that said means (c) includes means for causing the first signal transition of said predetermined direction at the input of said counter following enablement of said gate to result from a level switching transition in the clock pulse signal.

23. In a system for measuring off a precise time interval each time a stimulating input signal is received, such system having a. a precision frequency source of clock pulses which form a signal switching between 0 and 1 logic levels, b. a counter adapted to respond to a wave front of predetermined direction (either 0 to 1 or 1 to 0).

c. gate means receiving as a primary input said clock pulses and having its output coupled to said counter, d. a bistate device coupled to said gate means to enable and disable the latter when in the set or reset state, respectively, e. means responsive to each of successive input signals, which are random and non-synchronized in relation to said clock pulses, for setting said bistate device, and f. means responsive to the counter reaching a predetermined count state for (i) resetting said bistate device, and (ii) resetting the counter to a predetermined reset state, the improvement comprising means for coupling the outpt of said gate means to the input of said counter such that the first wave front of said predetermined direction applied to the counter input following each enablement of said gate means is created in consequence of a level switching of the clock pulses signal.

* * * * *